(12) United States Patent
Koyama et al.

(10) Patent No.: US 7,312,473 B2
(45) Date of Patent: Dec. 25, 2007

(54) DISPLAY DEVICE AND ELECTRONIC DEVICE USING THE SAME

(75) Inventors: Jun Koyama, Kanagawa (JP); Atsuo Isobe, Kanagawa (JP); Hiroshi Shibata, Yamagata (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 222 days.

(21) Appl. No.: 10/329,993

(22) Filed: Dec. 27, 2002

(65) Prior Publication Data

US 2003/0230750 A1   Dec. 18, 2003

(51) Int. Cl.
*H01L 29/00* (2006.01)
*H01L 29/94* (2006.01)
*H01L 33/00* (2006.01)

(52) U.S. Cl. .................. 257/88; 257/368; 257/390; 257/401; 257/E25.016; 257/E51.018; 257/E33.001; 257/E27.111

(58) Field of Classification Search ............... 257/72, 257/73, 74, 75, E21.134, 100, 88, 368, 390, 257/401, E25.016; 349/39, 123; 345/98, 345/76, 55; 438/30
See application file for complete search history.

(56) References Cited

U.S. PATENT DOCUMENTS

| | | | |
|---|---|---|---|
| 4,330,363 A | 5/1982 | Biegesen et al. | |
| 5,097,297 A | 3/1992 | Nakazawa | |
| 5,163,220 A | 11/1992 | Zeto et al. | |
| 5,636,042 A * | 6/1997 | Nakamura et al. | 349/123 |
| 5,643,826 A | 7/1997 | Ohtani et al. | |
| 5,759,879 A | 6/1998 | Iwasaki | |
| 5,841,097 A | 11/1998 | Esaka et al. | |
| 5,847,780 A * | 12/1998 | Kim et al. | 349/39 |
| 5,854,803 A | 12/1998 | Yamazaki et al. | |
| 5,858,823 A | 1/1999 | Yamazaki et al. | |
| 5,932,893 A | 8/1999 | Miyanaga et al. | |
| 5,965,915 A | 10/1999 | Yamazaki et al. | |
| 5,981,974 A | 11/1999 | Makita | |

(Continued)

FOREIGN PATENT DOCUMENTS

EP   1 049 144   11/2000

(Continued)

OTHER PUBLICATIONS

Akito Hara et al., *Ultra-High Performance Poly-Si TFTs on a Glass by a Stable Scanning CW Laser Lateral Crystallization*, AM-LCD '01, Jan. 1, 2001, pp. 227-230, Jan. 1, 2001.

(Continued)

*Primary Examiner*—Evan Pert
(74) *Attorney, Agent, or Firm*—Eric J. Robinson; Robinson Intellectual Property Law Office, P.C.

(57) ABSTRACT

In display devices using thin film transistors, a graphoepitaxy is used for a semiconductor layer crystallizing process. Thus, a display device in which crystallinity is improved, a variation in characteristics of thin film transistors is reduced, display nonuniformity is less, and a display quality is superior is provided. Steps are formed on a substrate in advance and an amorphous silicon film is formed thereon, and then laser crystallization is conducted in a direction perpendicular to the steps.

39 Claims, 18 Drawing Sheets

U.S. PATENT DOCUMENTS

| | | | |
|---|---|---|---|
| 5,986,306 A | | 11/1999 | Nakajima et al. |
| 6,057,183 A | | 5/2000 | Koyama et al. |
| 6,288,414 B1 | | 9/2001 | Ahn |
| 6,307,214 B1 | | 10/2001 | Ohtani et al. |
| 6,331,718 B1 | | 12/2001 | Yamazaki et al. |
| 6,355,940 B1 | | 3/2002 | Koga et al. |
| 6,365,933 B1 | | 4/2002 | Yamazaki et al. |
| 6,388,386 B1 | * | 5/2002 | Kunii et al. ............. 315/169.3 |
| 6,410,368 B1 | * | 6/2002 | Kawasaki et al. .......... 438/145 |
| 6,424,331 B1 | * | 7/2002 | Ozawa ........................ 345/98 |
| 6,429,100 B2 | | 8/2002 | Yoneda |
| 6,475,840 B1 | | 11/2002 | Miyanaga et al. |
| 6,512,246 B1 | | 1/2003 | Tanabe |
| 6,512,504 B1 | | 1/2003 | Yamauchi et al. |
| 6,538,632 B1 | | 3/2003 | Yamazaki et al. |
| 6,583,440 B2 | | 6/2003 | Yasukawa |
| 6,632,696 B2 | * | 10/2003 | Kimura et al. ................ 438/30 |
| 6,677,611 B2 | | 1/2004 | Yamazaki et al. |
| 6,841,797 B2 | * | 1/2005 | Isobe et al. ................... 257/64 |
| 6,879,309 B2 | | 4/2005 | Yamauchi et al. |
| 7,001,829 B1 | | 2/2006 | Yamazaki et al. |
| 7,015,057 B2 | | 3/2006 | Koyama et al. |
| 7,027,022 B2 | | 4/2006 | Koyama et al. |
| 7,042,432 B2 | | 5/2006 | Yamazaki et al. |
| 2001/0011970 A1 | | 8/2001 | Koyama et al. |
| 2001/0035526 A1 | | 11/2001 | Yamazaki et al. |
| 2002/0004292 A1 | | 1/2002 | Yamazaki et al. |
| 2002/0048864 A1 | | 4/2002 | Yamazaki et al. |
| 2002/0075208 A1 | * | 6/2002 | Bae et al. ..................... 345/76 |
| 2002/0098628 A1 | | 7/2002 | Hamada et al. |
| 2002/0134981 A1 | | 9/2002 | Nakamura et al. |
| 2003/0001800 A1 | * | 1/2003 | Nakajima et al. ............. 345/55 |
| 2003/0128200 A1 | * | 7/2003 | Yumoto ...................... 345/211 |
| 2003/0141505 A1 | | 7/2003 | Isobe et al. |
| 2003/0141521 A1 | | 7/2003 | Isobe et al. |
| 2003/0181043 A1 | | 9/2003 | Tanada et al. |
| 2003/0183854 A1 | | 10/2003 | Kato et al. |
| 2003/0183875 A1 | | 10/2003 | Isobe et al. |
| 2003/0186490 A1 | | 10/2003 | Kato et al. |
| 2003/0209710 A1 | | 11/2003 | Yamazaki et al. |
| 2003/0218169 A1 | | 11/2003 | Isobe et al. |
| 2003/0218170 A1 | | 11/2003 | Yamazaki et al. |
| 2003/0218171 A1 | | 11/2003 | Isobe et al. |
| 2003/0218177 A1 | * | 11/2003 | Yamazaki ..................... 257/84 |
| 2003/0219935 A1 | | 11/2003 | Miyairi et al. |
| 2003/0230749 A1 | * | 12/2003 | Isobe et al. ................... 257/59 |
| 2003/0230750 A1 | | 12/2003 | Koyama et al. |
| 2004/0016958 A1 | | 1/2004 | Kato et al. |
| 2004/0016967 A1 | | 1/2004 | Yamazaki et al. |
| 2004/0135174 A1 | | 7/2004 | Yamazaki et al. |
| 2005/0184936 A1 | | 8/2005 | Yamauchi et al. |
| 2006/0189105 A1 | | 8/2006 | Koyama et al. |
| 2006/0267018 A1 | | 11/2006 | Yamazaki et al. |
| 2006/0279503 A1 | | 12/2006 | Yamazaki et al. |

FOREIGN PATENT DOCUMENTS

| | | |
|---|---|---|
| EP | 1 049 176 | 11/2000 |
| JP | 61-241909 | 10/1986 |
| JP | 62-104117 | 5/1987 |
| JP | 63-031108 | 2/1988 |
| JP | 06-349735 | 12/1994 |
| JP | 07-130652 | 5/1995 |
| JP | 08-062637 | 3/1996 |
| JP | 08-070129 | 3/1996 |
| JP | 08-078329 | 3/1996 |
| JP | 08-195357 | 7/1996 |
| JP | 08-288515 | 11/1996 |
| JP | 09-074205 | 3/1997 |
| JP | 10-125923 | 5/1998 |
| JP | 10-135468 | 5/1998 |
| JP | 10-135469 | 5/1998 |
| JP | 10-200114 | 7/1998 |
| JP | 11-068113 | 3/1999 |
| JP | 11-084418 | 3/1999 |
| JP | 11-121753 | 4/1999 |
| JP | 11-354442 | 12/1999 |
| JP | 2000-003875 | 1/2000 |
| JP | 2000-022462 | 1/2000 |
| JP | 2000-68520 | 3/2000 |
| JP | 2000-223279 | 8/2000 |
| JP | 2000-332253 | 11/2000 |
| JP | 2000-349296 | 12/2000 |
| JP | 2001-011085 | 1/2001 |
| JP | 2001-013893 | 1/2001 |
| JP | 2001-144027 | 5/2001 |
| JP | 2002-014337 | 1/2002 |
| JP | 2002-313811 | 10/2002 |
| JP | 2002-324808 | 11/2002 |

OTHER PUBLICATIONS

Henry I. Smith et al., *Oriented Crystal Growth on Amorphous Substrates Using Artificial Surface-Relief Gratings*, 1978 American Institute of Physics, Appl. Phys. Lett. 32(6), Mar. 15, 1978, pp. 349-350.

M. W. Geis et al., *Crystallorgraphic Orientation of Silicon on an Amorphous Substrate Using an Artificial Surface-Relief Grating and Laser Crystallization*, 1979 American Institute of Physics, Appl. Phys. Lett. 35(1), Jul. 1, 1979, pp. 71-74.

D.K. Biegelsen et al., *Laser-Induced Crystallization of Silicon Islands on Amorphous Substrates: Multilayer Structures*, 1981 American Institute of Physics, Appl. Phys. Lett. 38(3), Feb. 1, 1981, pp. 150-152.

H.W. Lam et al., *Characteristics of MOSFETS Fabricated in Laser-Recrystallized Polysilicon Islands with a Retaining Wall Structure on an Insulating Substrate*, 1980 IEEE, IEEE Electron Device Letters, vol. EDL-1, No. 10, Oct. 1980, pp. 206-208.

Masatake Kishino et al., *Physics of VLSI Device*, Maruzen Co., Ltd., 1995, pp. 144-146.

Geis et al., "Crystalline Silicon on Insulators by Graphoepitaxy," IEEE 1979, pp. 210-212.

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

Tsutsui et al., "Electroluminesence in Organic Thin Films," Photochemical Processes in Organized Molecular Systems, 1991, pp. 437-450 (Elsevier Science Publishers, Tokyo, 1991).

M.A. Baldo et al., "Highly Efficient Phosphorescent Emission from Organic Electroluminescent Devices," Nature vol. 395, Sep. 10, 1998, pp. 151-154.

M.A. Baldo et al., "Very High-Efficiency Green Organic Light-Emitting Devices Based on Electrophorescence," Applied Physics Letters, vol. 75, No. 1, Jul. 5, 1999, pp. 4-6.

Tsutsui et al., "High Quantum Efficiency in Organic Light-Emitting Devices with Iridium-Complex as a Triplet Emissive Center," Japanese Journal of Applied Physics, vol. 38, Part 12B, Dec. 15, 1999, pp. L1502-L1504.

Geis et al., *Crystalline Silicon on Insulators by Graphoepitaxy*, IEDM 79 Technical Digest of International Electron Devices Meeting, 1979, pp. 210-212.

* cited by examiner

Cross section along B-B' line

Cross section along C-C' line

DISPLAY DEVICE AND ELECTRONIC DEVICE USING THE SAME

BACKGROUND OF THE INVENTION

1. Field of the Invention

The present invention relates to a display device, particularly, to a display device using a thin film transistor formed on the transparent substrate such as glass or plastic. Further, it relates to an electronic apparatus using the display device.

2. Description of the Related Art

In recent years, a cellular phone has been becoming popular by developing communication technology. In future, electrical transmission of moving pictures and transmission of a large quantity of information will be expected. With being lightened, a mobile personal computer is into production. An information device called a personal digital assistant (PDA) developed from electrical books is produced and becoming popular. With developing a display device and the like, most of such portable information devices are equipped with flat displays.

The latest technology aims at using an active matrix display device as a display device used in the portable information device.

In the active matrix display device, TFTs (thin film transistors) are provided in correspondence with respective pixels to control pictures. The active matrix display device has an advantages that the high definition of images is possible, the improvement of image quality is possible, the correspondence to moving image is possible, and the like, compared to a passive matrix display device. Therefore, the display device of the portable information device will be changed from a passive matrix type to an active matrix type.

Above all, a display device using low-temperature polysilicon has been production in recent years. In the low-temperature polysilicon technology, the driver circuit using TFTs can be formed simultaneously in the periphery of a pixel portion in addition to a pixel TFT that constitutes a pixel. Thereby, the low-temperature polysilicon technology can contribute to miniaturization of devices and low power consumption. Accordingly, the low-temperature polysilicon device becomes indispensable to the display device of the mobile device that has been widely applied to various fields in recent years.

In recent years, the development of a display device using an organic electro luminescence element (OLED) has been becoming more and more active. Hereinafter, the OLED includes both the OLED using luminescence from singlet exciton (fluorescence) and the OLED using luminescence from triplet exciton (phosphorescence) here. In this specification, the OLED is described as an example of a light emitting element, however, another light emitting elements can be used.

The OLED has a structure in which an OLED layer is interposed between a pair of electrodes (an anode and a cathode), and usually has a laminated structure. Representatively, there is a laminated structure which is called "hole transporting layer, light emitting layer, electron transporting layer", proposed by Tang et al. of Kodak Eastman Company.

Other structures may also be adopted, such as a structure in which "a hole injecting layer, a hole transporting layer, a light emitting layer and an electron transporting layer" are stacked on an anode in order, or a structure in which "a hole injecting layer, a hole transporting layer, a light emitting layer, an electron transporting layer and an electron injecting layer" are laminated on an anode in order. The light emitting layer may also be doped with a fluorescent pigment or the like.

In this specification, all layers provided between a cathode and an anode are herein generically called "OLED layer". Accordingly, all the aforementioned hole injecting layer, hole transporting layer, light emitting layer, electron transporting layer and electron injecting layer are encompassed in the OLED layer. A light emitting element constituted of an anode, an OLED layer, and a cathode is called "OLED".

FIG. 3 shows an example of the construction of a pixel portion of an active matrix type OLED display device. A gate signal line (G1 to Gy) to which a selection signal is to be inputted from a gate signal line driver circuit is connected to a gate electrode of a switching TFT 301 which is provided in each pixel of the pixel portion. Either one of source and drain regions of the switching TFT 301 provided in each pixel is connected to a source signal line (S1 to Sx) to which a signal is to be inputted from a source signal line driver circuit, while the other is connected to a gate electrode of an OLED driving TFT 302 and to either one of electrodes of a capacitor 303 which is provided in each pixel. The other electrode of the capacitor 303 is connected to a power supply line (V1 to Vx). Either one of source and drain regions of the OLED driving TFT 302 provided in each pixel is connected to the power supply line (V1 to Vx), while the other is connected to one of electrodes of the OLED 304 provided in each pixel.

The OLED 304 has an anode, a cathode and an OLED layer provided between the anode and the cathode. If the anode of the OLED 304 is connected to the source region or the drain region of the OLED driving TFT 302, the anode and the cathode of the OLED 304 become a pixel electrode and a counter electrode, respectively. Contrarily, if the cathode of the OLED 304 is connected to the source region or the drain region of the OLED driving TFT 302, the cathode and the anode of the OLED 304 become a pixel electrode and a counter electrode, respectively.

Incidentally, the potential of the counter electrode is herein called "counter potential", and a power source for applying the counter potential to the counter electrode is herein called "counter power source". The difference between the potential of the pixel electrode and the potential of the counter electrode is an OLED driving voltage, and the OLED driving voltage is applied to the OLED layer.

As a gray scale display method for the above-described OLED display device, there are an analog gray scale method and a time gray scale method.

First, the analog gray scale method for the OLED display device will be described below. FIG. 4 is a timing chart showing the case driving the display device shown in FIG. 3 by the analog gray scale method. The period that starts when one gate signal is selected and finishes when the next gate signal line is selected is herein called "one line period (L)". The period that starts when one image is selected and finishes when the next image is selected corresponds to one frame period. In the case of the OLED display device shown in FIG. 5, the number of gate signal lines is "y", and y-number of line periods (L1 to Ly) are provided in one frame period.

As resolution of the OLED display device becomes higher, the number of line periods for one frame period becomes larger, and the driver circuit of the OLED display device must be driven at a higher frequency.

The power source lines (V1 to Vx) are kept at a constant voltage (power source potential). In addition, the counter potential is kept constant. The counter potential has a potential difference from the power source potential so that the OLED emit light.

In the first line period (L1), a selection signal from the gate signal line driver circuit is inputted to the gate signal line G1. Then, analog video signals are inputted to the source signal lines (S1 to Sx) in order.

Since all the switching TFTs 301 connected to the gate signal line GI are turned on, the analog video signals inputted to the source signal lines (S1 to Sx) are respectively inputted to the gate electrodes of the OLED driving TFTs 302 via the switching TFTs 301.

According to the potential of the analog video signal inputted into the pixel when the switching TFT 301 is turned on, the gate voltage of the OLED driving TFT 302 varies. At this time, the drain current of the OLED driving TFT 302 to the gate voltage is determined at a 1-to-1 ratio in accordance with the Id-Vg characteristic of the OLED driving TFT 302. Specifically, according to the potential of the analog video signal inputted to the gate electrode of the OLED driving TFT 302, the potential of the drain region of the OLED driving TFT 302 (an OLED driving voltage which is corresponding to the on state) is determined, a predetermined drain current flows into the OLED 304, and the OLED 304 emits light at the amount of emission which is corresponding to the amount of the drain current.

When the above-described operation is repeated until the termination of inputting the analog video signals to the respective source signal lines (S1 to Sx), the first line period (L1) terminates. Incidentally, one line period may also be defined as the sum of the period required until the termination of inputting the analog video signals to the respective source signal lines (S1 to Sx) and a horizontal retrace period. Then, the second line period (L2) starts, and a selection signal is inputted to the gate signal line G2. Similarly to the first line period (L1), analog video signals are inputted to the source signal lines (S1 to Sx) in order.

When selection signals are inputted to all the gate signal lines (Gl to Gy), all the line periods (L1 to Ly) terminate. When all the line periods (L1 to Ly) terminate, one frame period terminates. During one frame period, all the pixels perform displaying and one image is formed. Incidentally, one frame period may also be defined as the sum of all the line periods (L1 to Ly) and a vertical retrace period.

As described above, the amount of emission of the OLED is controlled by the analog video signal, and gray scale display is provided by controlling the amount of emission. In the analog gray scale method, gray scale display is carried out by the variation in the potentials of the respective analog video signals inputted to the source signal lines.

The time gray scale method will be described below.

In the time gray scale method, digital signals are inputted to pixels to select a emitting state or a non-emitting state of the respective OLED, whereby gray scales are represented by accumulating periods per frame period during which each of the OLED emits.

In the following description, $2^n$ gray scales (n is a natural number) are represented. FIG. 5 is a timing chart showing the case of driving the display device shown in FIG. 3 by the time gray scale method. One frame period is divided into n-number of sub-frame periods ($SF_1$ to $SF_n$). Incidentally, the period for which all the pixels in the pixel portion display one image is called "one frame period (F)". Plural periods into which one frame period is divided are called "sub-frame periods", respectively. As the number of gray scales increases, the number into which one frame period is divided also increases, and the driver circuit of the OLED display device must be driven at a higher frequency.

One sub-frame period is divided into a write period (Ta) and a display period (Ts). The write period is a period for which digital signals are inputted to all the pixels during one sub-frame period, and the display period (also called "lighting period") is a period for which the respective OLED are in an emitting state or a non-emitting state in accordance with the input digital signals, thereby perform displaying.

The OLED driving voltage shown in FIG. 5 represents the OLED driving voltage of an OLED for which the emitting state is selected. Specifically, the OLED driving voltage (FIG. 3) of the OLED for which the emitting state is selected is 0 V during the write period, and has a magnitude which enables the OLED to emit light, during the display period.

The counter potential is controlled by an external switch (not shown) so that the counter potential is kept at approximately the same level as the power source potential during the write period, and has, during the display period, a potential difference from the power source potential to so that the OLED emits light.

The write period and the display period of each sub-frame period will first be described in detail with reference to FIGS. 3 and 5, and subsequently, the time gray scale method will be described.

First, a gate signal is inputted to the gate signal line G1, and all the switching TFTs 301 connected to the gate signal line G1 are turned on. Then, digital signals are inputted to the source signal lines (S1 to Sx) in order. The counter potential is kept at the same level as the potential of the power supply lines (V1 to Vx) (power source potential). Each of the digital signals has information of "0" or "1", that is, each of the digital signals of "0" or "1" has a voltage of high level or low level.

Then, the digital signals inputted to the source signal lines (SI to Sx) are respectively inputted to the gate electrodes of the OLED driving TFTs 302 via the switching TFTs 301 which are in the on state. The respective digital signals are also inputted to the capacitors 303 and stored.

Then, the above-described operation is repeated by inputting gate signals to the respective gate signal lines (G2 to Gy) in order, whereby digital signals are inputted to all the pixels and the input digital signal is held in each of the pixels. The period required until the digital signals are inputted to all the pixels is called "write period".

When the digital signals are inputted to all the pixels, all the switching TFTs 301 are turned off. Thus, the external switch (not shown) connected to the counter electrode causes the counter potential to vary so that a potential difference that enables the OLED 304 to emit light is produced between the counter potential and the power source potential.

In the case where the digital signals have information of "0", the OLED driving TFTs 302 are turned off and the OLED 304 do not emit light. Contrarily, in the case where the digital signals have information of "1", the OLED driving TFTs 302 are turned on. Consequently, the pixel electrodes of the respective OLED 304 are kept at approximately the same potential as the power source potential, and the OLED 304 emit light. In this manner, the emitting state or the non-emitting state of the OLED 304 is selected in accordance with the information of the digital signals, and all the pixels perform displaying at the same time. When all the pixels perform display, an image is formed. The period for which the pixels perform displaying is called "display period".

The lengths of the write periods ($T_{a1}$ to $T_{an}$) of all the n-number of sub-frame periods ($SF_1$ to $SF_n$) are the same. The display periods (Ts) of the respective sub-frame periods ($SF_1$ to $SF_n$) are denoted by $T_{s1}$ to $T_{sn}$.

The lengths of the respective display periods are set to become $T_{s1}:T_{s2}:T_{s3}:\ldots:T_{s(n-1)}:T_{sn}=2^0:2^{-1}:2^2:\ldots:2^{-(n-2)}:2^{-(n-1)}$, respectively. By combining desired ones of these display periods, it is possible to provide a desired gray scale of $2^n$ gray scales.

The display period is any one of $T_{s1}$ to $T_{sn}$. Here, it is assumed that predetermined pixels are turned on for $T_{s1}$.

Then, when the next write period starts and data signals are inputted to all the pixels, the next display period starts. At this time, the display period is any one of $T_{s2}$ to $T_{sn}$. Here, it is assumed that predetermined pixels are turned on for $T_{s2}$.

The same operation is repeated as to the remaining (n−2)-number of sub-frames, whereby the display periods are set as $T_{s3}, T_{s4}, \ldots, T_{sn}$ in order and predetermined pixels are turned on during each of the sub-frames.

When the n-number of sub-frame periods appear, one frame period terminates. At this time, the gray scale of a pixel is determined by cumulatively calculating the length of the display periods for which the pixel is turned on. For example, assuming that n =8 and the obtainable luminance in the case where the pixel emits light for all the display periods is 100%, a luminance of 75% can be represented if the pixel emits light during $T_{s1}$ and $T_{s2}$ and a luminance of 16% can be realized if $T_{s3}$, $T_{s5}$ and $T_{s8}$ are selected.

Incidentally, in the driving method of the time gray scale method which represents gray scales by inputting n-bit digital signals, the number of plural sub-frame periods into which one frame period is divided, and the lengths of the respective sub-frame periods and the like are not limited to the above-described examples.

With respect to the conventional OLED display device as described above, there are the following problems.

According to an OLED display device using an analog system, when an OLED is turned on, an analog signal voltage is inputted to a source signal line and applied to the gate of a driver TFT through a switch TFT so that a voltage between the gate and the source connected with a power supply line becomes Vgs. Thus, a drain current of the driver TFT is controlled to control a current flowing into the OLED.

Even if a voltage equal to Vgs is applied to the driver TFTs in a pixel portion, mobility, a threshold value, or the like of the TFTs are varied so that a drain currents are varied. As a result, there is a problem that display nonuniformity is caused in a display device, thereby reducing a display quality.

Also, according to an OLED display device using a time gradation system, a TFT is not operated in a saturation region but operated a linear region and Vds of the TFT is set to a small value, for example, 0.1 V so that a substantially entire voltage on a power supply line can be applied to an OLED. Therefore, the OLED is driven by a constant voltage without being influenced by a variation in TFTs so that a preferable image quality with high uniformity can be obtained in a display device. However, with respect to this system, there is the following problem. The characteristics of the OLED are being deteriorated while a current flows into it. With respect to the deterioration, there are two modes. A first mode corresponds to a reduction in light emission efficiency, that is, a phenomenon in which a brightness is reduced even if a constant current flows. A second mode corresponds to a problem in which a VF (forward voltage of the OLED) is risen. In the time gradation system, the second mode particularly becomes a problem. The OLED within a screen do not uniformly emit light at all times. Thus, a pixel with a high turning-on ratio and a pixel with a low turning-on ratio exist according to an image. In the case of the pixel with a high turning-on ratio, the deterioration rapidly progresses as a matter of course. Therefore, when a constant voltage is provided, the brightness of such a pixel is reduced. This is caused as a burn phenomenon so that the image quality of the display device is reduced.

As described above, even in either the analog system or the time gradation system, a problem is caused. In the case of the analog system, the improvement of characteristics of the OLED is required and it is important to conduct approaches with respect to materials. In addition, with respect to the improvement of the analog system, it is urgent to reduce a variation in TFT.

Also, even in a display device using an inorganic EL material, an FED display device, an electrophoretic display device, a liquid crystal display device, and the like, other than the display device using the OLED, a liquid crystal display device in which an analog buffer circuit and an DA converting circuit are incorporated is being developed as the display device is systemized. For the analog buffer circuit and the DA converting circuit, circuit precision is required. Thus, characteristics with small variations are required for the TFT.

When a display device using low temperature polysilicon is manufactured, it is general to crystallize an amorphous silicon film formed on a glass substrate by laser light. In the case of high temperature polysilicon using a quartz substrate, an amorphous silicon film is heated for thermal crystallization. However, the quartz substrate is expensive so that it is currently used for only a display device for projector having a small size. Thus, in order to provide a low cost display device, a glass substrate and laser crystallization are essential matters.

With respect to a laser oscillation device, there are a gas laser represented by an excimer laser, a solid laser represented by a YAG laser, and the like, which are used for crystallizing a surface layer of a semiconductor film in an extremely short time. The laser is broadly divided into two types, a pulse oscillation and a continuous oscillation according to an oscillation method. According to the pulse oscillation laser, its output energy is relatively high. Thus, when a size of a beam spot is set to several $cm^2$, the productivity can be improved. In particular, when a shape of the beam spot is processed by using an optical system and thus made to a linear shape with a length of 10 cm or more, laser light irradiation to a substrate can be efficiently conducted to improve the productivity. Therefore, a pulse oscillation excimer laser is widely used for laser irradiation.

In recent years, it is found that a crystal grain size in a semiconductor film in the case where the continuous oscillation laser is used for laser crystallization becomes lager than that in the case where the pulse oscillation laser is used. For a semiconductor film having a large crystal grain size, the improvement of mobility and the reduction in variation resulting from the existence of a grain boundary are required.

However, with respect to a semiconductor film formed by laser crystallization using a laser, generally, a plurality of crystal grains are aggregated and formed, and these positions and sizes are random so that it is difficult to form a crystalline semiconductor film with designating a position and a size of a crystal grain. Thus, a grain boundary exists in a channel of a TFT. An infinite number of recombination centers and trapping centers resulting from the use of an amorphous structure, a crystal defect, and the like exist in the grain boundary as being different from the inner portion of the crystal grain. When a carrier is trapped in the trapping center, it is known that a potential of the grain boundary is increased and it becomes a barrier to the carrier, thereby reducing a current transport characteristic of the carrier. Therefore, when the grain boundary exists in the channel of the TFT, the mobility of the TFT is reduced, its threshold value is risen, or its off current is increased, that is, the characteristics of the TFT are greatly influenced. In addition, in each of a plurality of TFTs, the manner of existence of grain boundaries is completely independent. Thus, this causes a variation in characteristics of the TFTs. This variation causes a variation in on current in the above-mentioned driver TFT, thereby deteriorating the image quality of the display device.

The reason why positions of crystals obtained when laser light is irradiated to a semiconductor and sizes of grain boundaries become random is as follows. It takes some times to generate a solid phase nucleus in a liquid semiconductor film completely melted by laser light irradiation. Countless crystal nuclei are generated in a complete melting region with a lapse of time and then crystals grow from the respective crystal nuclei. Positions in which the crystal nuclei are generated are random so that they are nonuniformly distributed. Then, when crystal grains collide with each other, crystal growth is stopped. Thus, the positions and the sizes of crystals become random.

Accordingly, it is ideal that the influence of the grain boundaries is eliminated and a channel formation region by which the characteristics of a TFT are greatly influenced is composed of single crystals. However, it is difficult to crystallize a crystallized film in which no grain boundary exists by a conventional laser crystallization method.

SUMMARY OF THE INVENTION

The present invention has been made in view of the above problems. An object of the present invention is to prevent a grain boundary from forming in a channel formation region of a TFT to reduce a deterioration and a variation in characteristics of the TFT such as a reduction in mobility, a rise in threshold value, and an increase in off current so that a display quality of a display device is improved. The present invention can be widely used for not only a display device using an OLED but also a display device using inorganic EL, an FED display device, an electrophoretic display device, a liquid crystal display device, and the like.

According to the present invention, in order to solve the above problems, the following is conducted. The direction of stress produced in a semiconductor film is closely related to a position and a direction of a grain boundary. FIG. 6 shows a TEM image in a direction perpendicular to laser light in the case where continuous oscillation laser light is irradiated to an amorphous semiconductor film having 200 nm such that a speed becomes 5 cm/sec. As is apparent from FIG. 6, three crystal grains appear and these widths in a direction perpendicular to the scanning direction are random. As shown in FIG. 6, there is a rise in the central portion of the semiconductor film. This may be because stress is applied in a direction parallel to the substrate from the vicinities of grain boundaries to the central portions of the crystal grains. Thus, the portions to which stress is concentratedly applied are intendedly formed in the semiconductor film so that the positions in which the grain boundaries are formed can be selectively specified.

According to the present invention, an insulating film to which unevenness is provided is formed on a substrate and a semiconductor film is formed on the insulating film. Thus, in crystallization by laser light, portions to which stress is concentratedly applied are selectively formed in the semiconductor film. More specifically, stripe-shaped or rectangular-shaped unevenness is provided to the semiconductor film. Continuous oscillation laser light is irradiated along the stripe-shaped unevenness or along the long side or the short side of the rectangular-shaped unevenness. At this time, it is preferable that the continuous oscillation laser light is used. Pulse oscillation laser light may be also used. Note that a cross section of a projection in a direction perpendicular to the scanning direction of the laser light may be a rectangle, a triangle, or a trapezoid.

In crystallization resulting from laser light irradiation, stress concentration is caused in the edges and vicinities of the depression of the semiconductor film or the edges and vicinities of the projection thereof so that grain boundaries are selectively formed. Stress in the central portion and vicinities of the projection of the semiconductor film or the central portion and vicinities of the depression thereof is smaller than that in the edges and vicinities of the depression of the semiconductor film or the edges and vicinities of the projection thereof. Thus, it is relatively hard to form grain boundaries. In addition, even if they are formed, the crystal grains become larger so that more superior crystallinity can be obtained.

According to the present invention, after the crystallization by laser light, the edges and vicinities of the depression of the semiconductor film or the edges and vicinities of the projection thereof are removed by patterning, and a portion which is located in the central portion and vicinities of the projection and has superior crystallinity is actively used as the active layer of a TFT, in particular, the channel formation region thereof. Thus, it can be prevented that the grain boundaries are formed in the channel formation region of the TFT so that a deterioration of TFT characteristics or an increase in a variation thereof which results from the existence of grain boundaries can be prevented. Note that a range corresponding to the edges and vicinities to be removed can be determined as appropriate by a designer.

With respect to the edge regions and vicinities of a beam spot of laser light, it is general that a density is low and crystallinity of semiconductor is inferior as compared with the central region and vicinities thereof in many cases. Thus, in scanning laser light, it is required that a portion which becomes the channel formation region of a TFT later, more preferably, the projection or the depression of the semiconductor film is not overlapped with the edges of track of laser light.

Also, conventionally, there is a semiconductor film crystallizing technique which is called a graphoepitaxy. This is to try epitaxial growth of a semiconductor film from the induction of surface relief grating artificially formed on an amorphous substrate surface. The technique related to the graphoepitaxy is described in "Crystalline Silicon on Insulators by Graphoepitaxy", M. W. Geis, et al., Technical Digest of International Electron Devices Meeting, 1979, p210, "Grapho-epitaxy of Silicon on Fused Silica Using Surface Micropatterns and Laser Crystallization", M. W. Geis, et al., J. Vac. Scl. Technol. 16(6), November/December, 1979, and the like. The above papers and the like disclose the graphoepitaxy in which a step is provided on the surface of an insulating film and processing such as heating or laser light irradiation is conducted for a semiconductor film formed on the insulating film so that crystals of the semiconductor film are eptaxially grown. However, a temperature required for eptaxial growth is at least 700° C. or more. Thus, when eptaxial growth is conducted on a glass substrate, grain boundaries are formed in the semiconductor film near the edges of the projection of the insulating film.

According to the present invention, a mask of the active region (island) of a TFT is laid out, and a shape of the depression or the projection of the insulating film or a position of the edges thereof is designed corresponding to the layout of the island so as to improve the crystallinity of a portion which becomes the island. More specifically, the shape and the size are determined such that the edges of the depression or the projection are not overlapped with the island. Using the insulating film designed according to the layout of the island, a semiconductor film in which grain boundaries are produced near the edges is intentionally formed. A portion which is located near the edges of the semiconductor film and in which a large number of grain boundaries exist is removed by patterning and a portion with relatively superior crystallinity is used as the island. Thus, the technique disclosed according to the present invention is the same as the above mentioned known technique with respect to a point that the semiconductor film is provided on the insulating film with the steps and then crystallized. However, the conventional technique does not include the concept in which the positions of grain boundaries are controlled by using the steps. Accordingly, the present invention is different from the conventional technique. In addition, according to the above papers, a circular beam spot of a laser is used. According to the present invention, a linear laser beam is used so that very effective crystallization can be progressed.

DETAILED DESCRIPTION OF THE PREFERRED EMBODIMENTS

An embodiment mode of the present invention will be described below.

Figure 2:
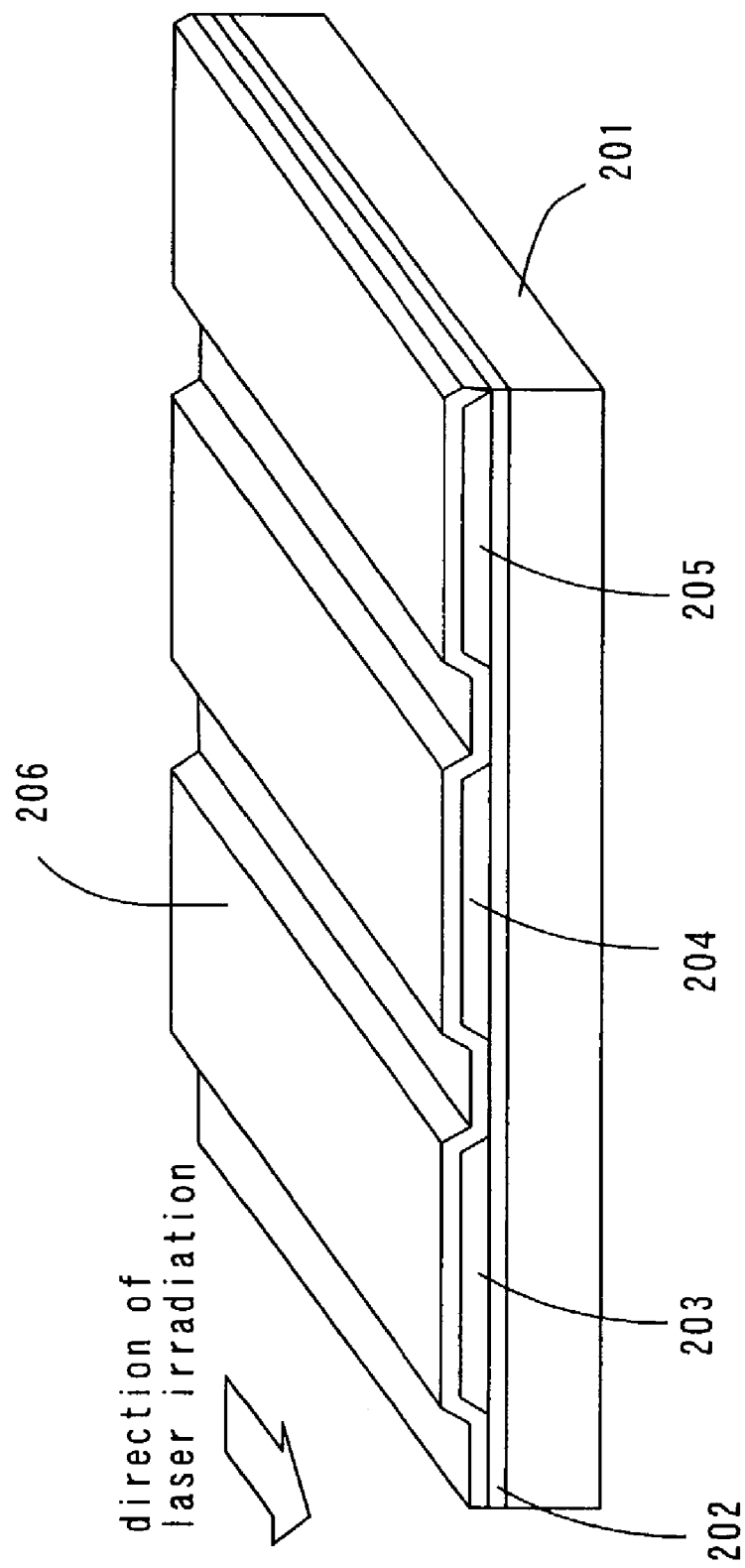
FIG. 2 is a view showing a substrate for which crystallization is conducted according to the present invention.
Figure 3:
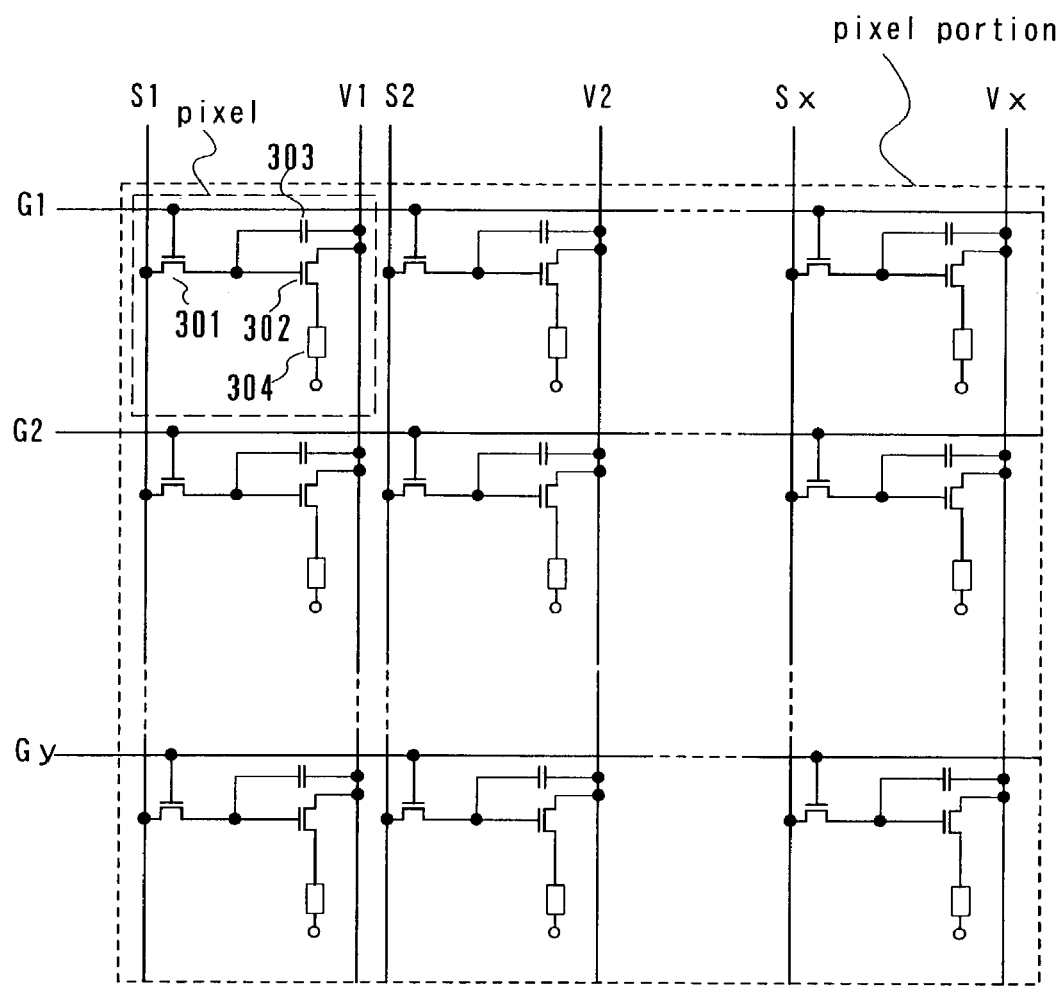
FIG. 3 is a view showing a circuit configuration of a pixel in a conventional display device.
Figure 4:
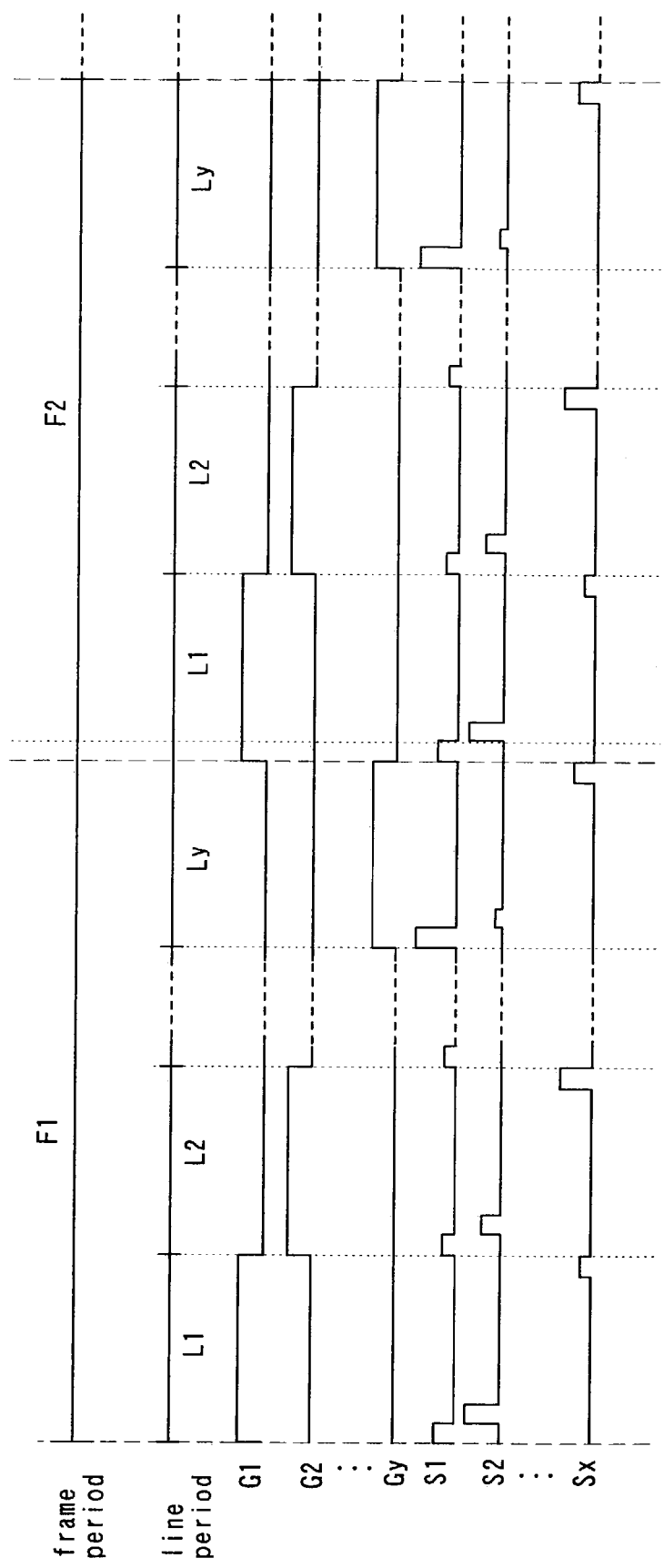
FIG. 4 is a timing chart showing a method of driving the pixel in the conventional display device.
Figure 5:
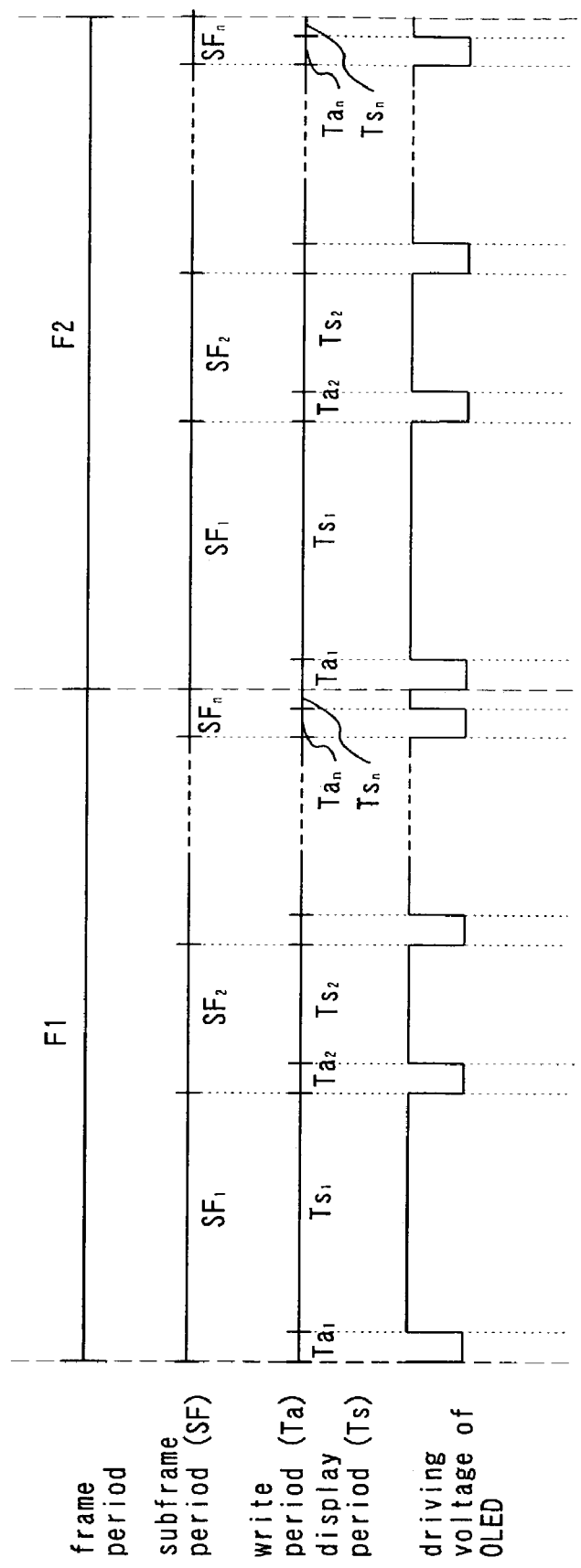
FIG. 5 is a timing chart showing a method of driving the pixel in the conventional display device.
Figure 6:
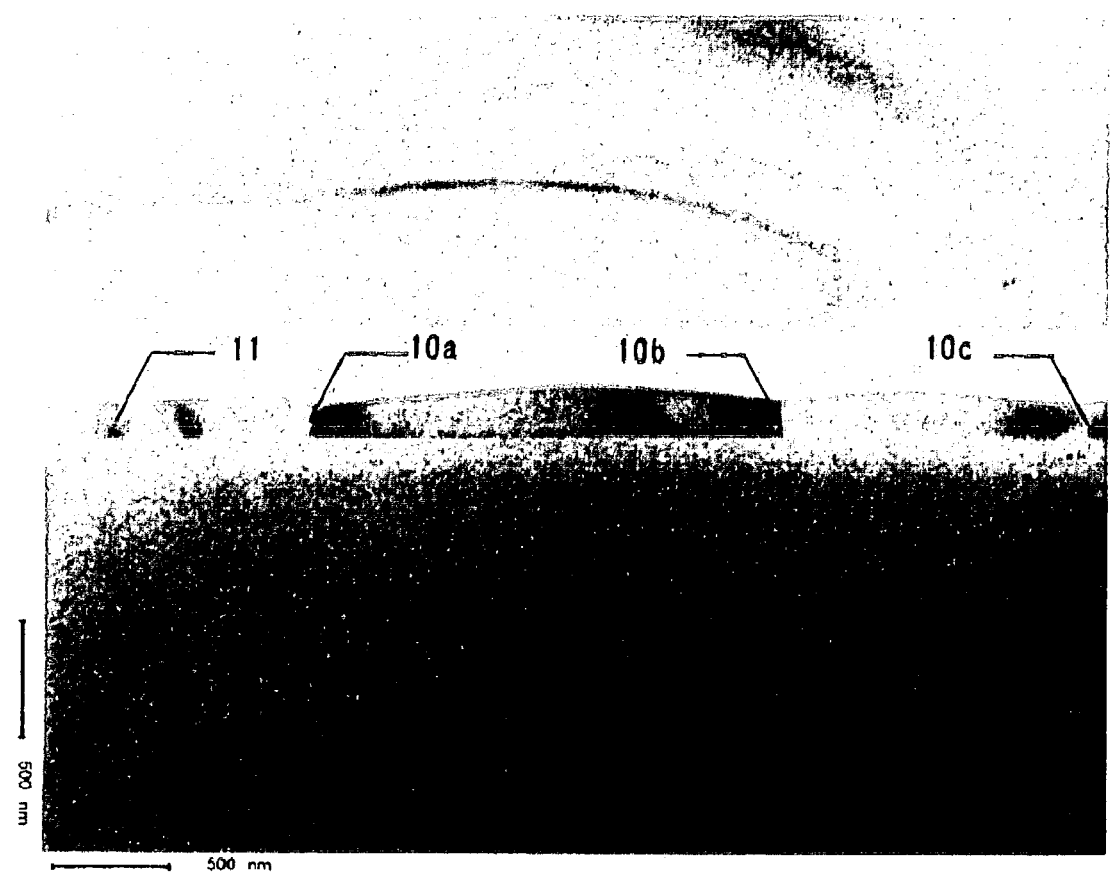
FIG. 6 is a TEM photograph of crystal.

First, as shown in FIG. 2, an insulating film is formed on a substrate 201 and patterned to form stripe-shaped steps. It is desirable that a width of stripes is 1 μm to 10 μm. However, the present invention is not necessarily limited to this value. Here, as the substrate, a quartz substrate, a silicon substrate, a glass substrate made of barium borosilicate glass, aluminoborosilicate glass, or the like, a plastic substrate, or a metallic substrate made of stainless steel or the like can be used. In addition, as the insulating film, a silicon oxide film, a silicon oxynitride film, a silicon nitride film, or the like can be used. The insulating film may be single film or a laminate film.

Next, a semiconductor film 206 is formed so as to cover the insulating film. The semiconductor film 206 is formed by a known method. The film can be formed by, for example, a sputtering method, an LPCVD method, or a plasma CVD method. Note that the semiconductor film 206 may be an amorphous semiconductor film, a micro-crystalline semiconductor film, or a polycrystalline semiconductor film. In addition, not only silicon but also silicon germanium can be used. When the unevenness has some height with respect to the thickness of the semiconductor film, unevenness also appears on the semiconductor film along the insulating film. It is desirable that the height of the insulating film is 30 nm to 300 nm.

Next, as shown in FIG. 2, laser light is irradiated to the semiconductor film 206 to form a semiconductor film having improved crystallinity. The energy density of the laser light becomes low in the edges and vicinities of a beam spot so that a crystal grain is small in the edges and vicinities and protruding portions (ridges) appear along a grain boundary of crystal. Thus, the arrangement is made such that the edges of track of a beam spot of laser light and a portion which becomes a channel region are not overlapped with each other. Note that the scanning direction of the laser light is set such that it is parallel to a direction in which the unevenness is formed as indicated by an arrow.

According to the present invention, a known laser can be used. It is desirable that laser light is continuous oscillation. However, even if it is pulse oscillation, it is considered that an effect of the present invention can be obtained. A solid laser or a gas laser can be used as the laser. For the gas laser, there are an excimer laser, an Ar laser, a Kr laser, and the like. For the solid laser, there are a YAG laser, a $YVO_4$ laser, a YLF laser, a $YAlO_3$ laser, a glass laser, a ruby laser, an alexandrite laser, a Ti: sapphire laser, and the like. In addition, a laser using crystal such as YAG, $YVO_4$, YLF, or $YAlO_3$, which is doped with Cr, Nd, Er, Ho, Ce, Co, Ti, or Tm is applied as the solid laser. The fundamental of the laser is changed according to a doping material, and laser light having a fundamental of about 1 ìm is obtained. A harmonic to the fundamental can be obtained by using a non-linear optical element.

In the semiconductor film crystallized by laser light irradiation, stress concentration is caused in the edges and vicinities of the projection or the edges and vicinities of the depression so that grain boundaries are easily generated. However, stress in a flat region of the projection or a flat region of the depression is smaller than that in the edges and vicinities so that grain boundaries are hard to be generated. Even if they are produced, relatively large crystal grains are obtained. Next, the semiconductor film after the crystallization is patterned such that the active layer of a TFT, in particular, the channel region thereof is located in the flat region of the projection or the flat region of the depression. Thus, a reduction in mobility, a rise in threshold value, an increase in off current, a variation in TFT characteristics resulting from them, and further a variation in display devices, which become problems in a conventional display device, can be suppressed or reduced by eliminating the use of the edge regions in which the probability of generation of grain boundary is high.

The display device of the present invention can be used for an OLED display device, a display device using an inorganic EL material, an FED display device, an electrophoretic display device, a liquid crystal display device, and the like.

Hereinafter, embodiments of the present invention will be described.

Embodiment 1

Figure 1:
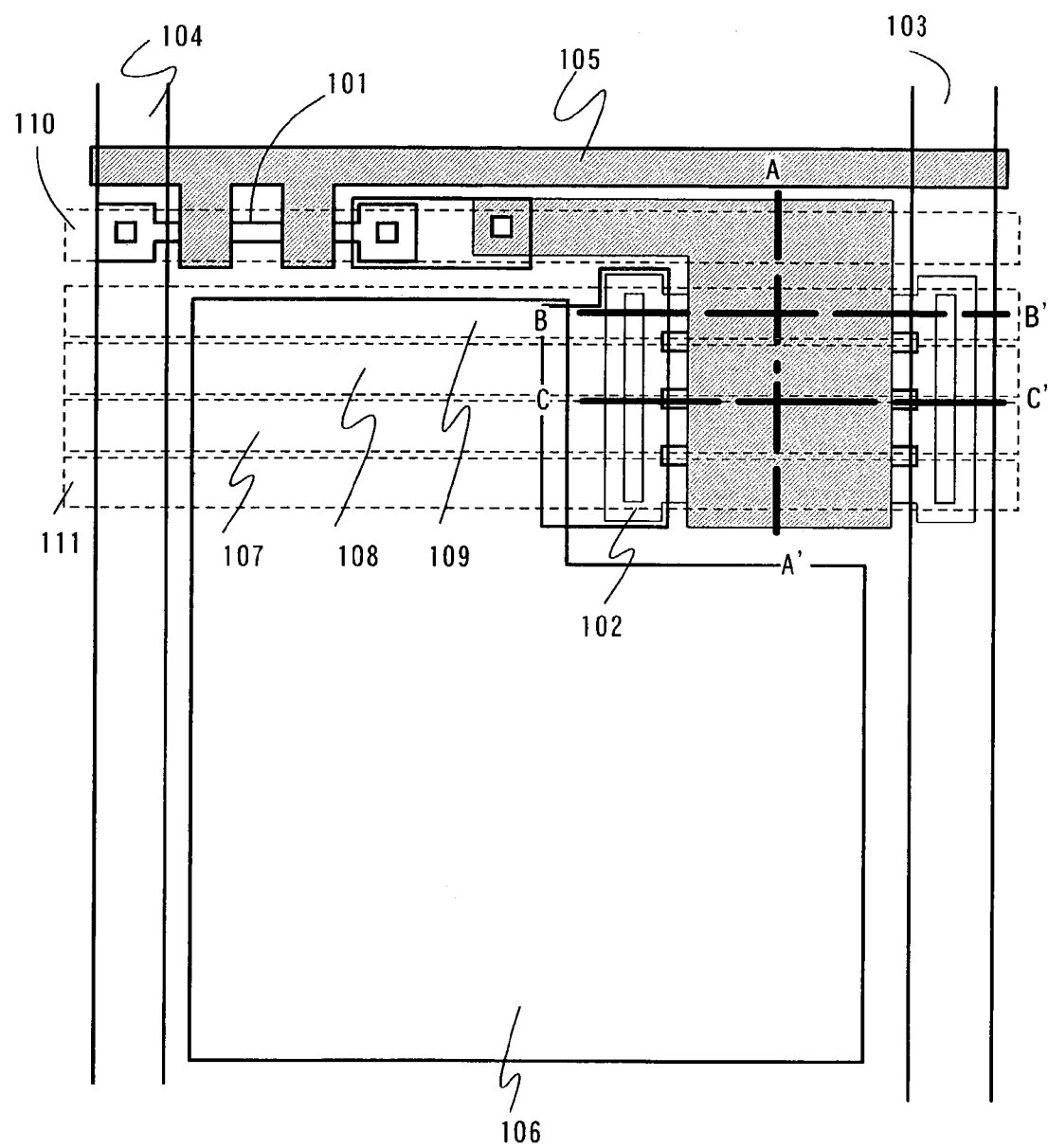
FIG. 1 is a plan view of a pixel in a display device of the present invention.

FIG. 1 shows an example in the case where the present invention is applied to an OLED display device. FIG. 1 is a plan view of TFTs composing a pixel. Here, reference numeral 101 denotes a switching TFT, 102 denotes a driver TFT, 103 denotes a power supply line, 104 denotes a source signal line, and 105 denotes a gate signal line. As described in "Description of the Related Art", it is important to reduce a variation in driver TFT for driving an OLED in the OLED display device. Thus, in this embodiment, not only a TFT is formed on a depression or a projection of an insulating film having unevenness but also multi-channelization is achieved so that a flow of current is uniformed to suppress a variation in current. A structure of the driver TFT is as follows.

Figure 7:
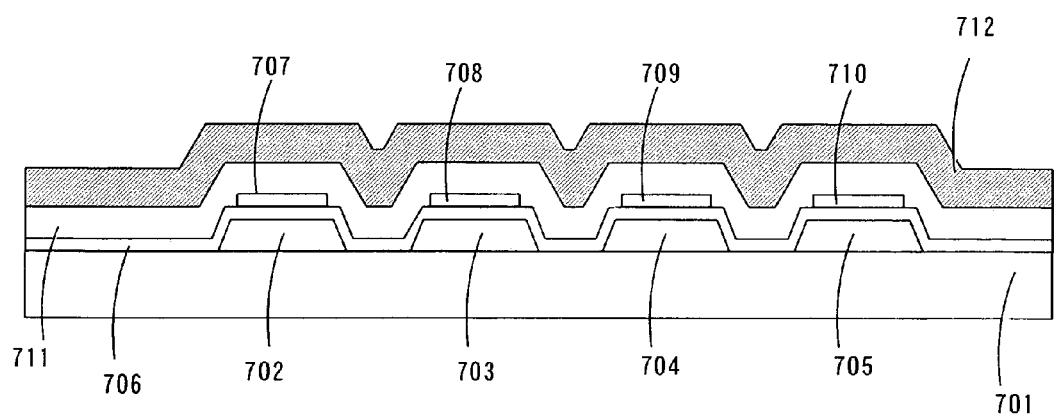
FIG. 7 is a cross sectional view of a TFT of the pixel of the present invention.
Figure 8A:
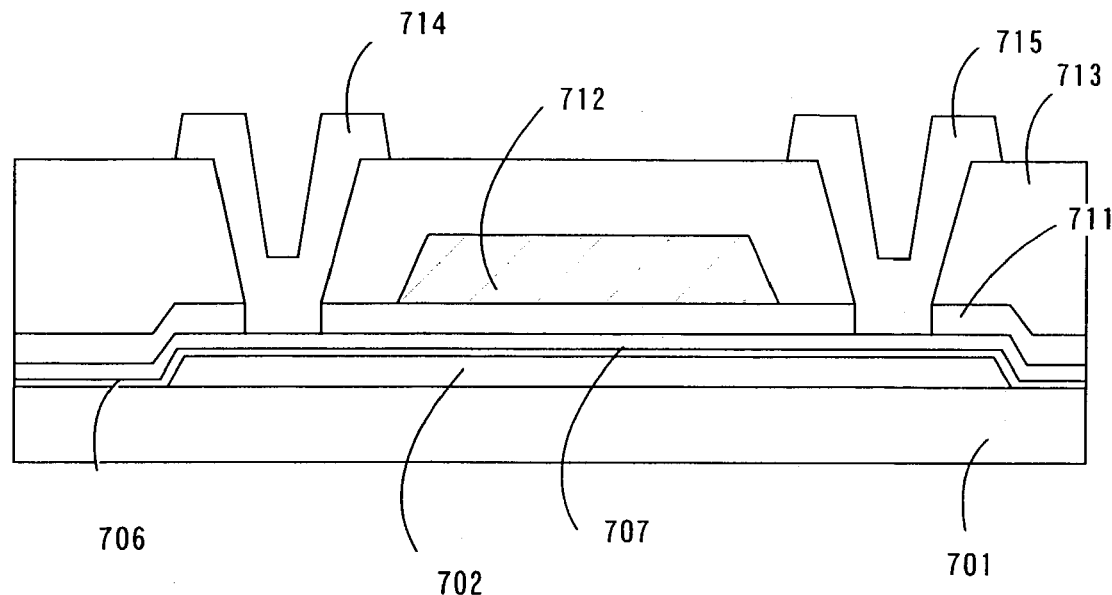
FIGS. 8A and 8B are cross sectional views of a TFT of the pixel of the present invention.
Figure 8B:
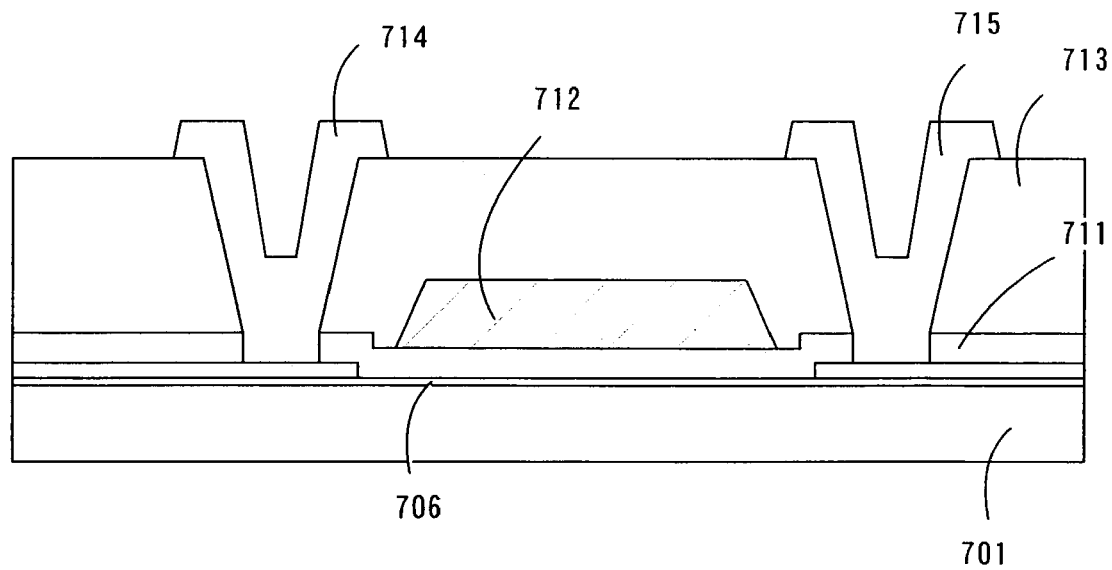

FIG. 1 shows an example in which the channel of the TFT is located on the projection of a base step. However, the present invention is not limited to the projection. Even if the channel is located on the depression, the present invention is effective. In the multi-channel TFT, source and drain regions become a single common region but a channel portion is divided into several sub-channels. When such a structure is used to aim for an averaging effect using the plurality of sub-channels, an effect of the present invention is more effective, in addition to the above-mentioned effect in which the flat portion of the step in which the number of grain boundaries is small is used so that the crystallinity is improved to reduce a variation in characteristics of the TFT. Cross sections of the driver TFT shown in FIG. 1 are shown in FIGS. 7, 8A, and 8B. FIG. 7 shows a cross section along a line A-A' in FIG. 1, and FIGS. 8A and 8B show cross sections along lines B-B' and C-C', respectively.

In FIG. 7, an oxide film is formed on a glass substrate 701 and patterned to form stripe-shaped steps 702, 703, 704, and 705. Next, an oxide film 706 is formed thin. The oxide film is to prevent contamination from influencing a silicon layer located above when the oxide film for forming a step is contaminated by patterning.

Subsequently, an amorphous silicon layer is formed following the oxide film 706. Then, crystallization is conducted and a gate insulating film 711 is formed. Subsequently, a gate metallic film is formed to form a gate electrode. In FIG. 7, a current flows in a direction perpendicular to the plane of this drawing. A current flows into the active layer of the TFT which is located on only the flat region of the projection of the step. Thus, TFT characteristics with less variation are obtained because of the above-mentioned reason.

FIGS. 8A and 8B are cross sectional views in a direction orthogonal to FIG. 7. In the cross sectional view along the line B-B', a current flows from a source electrode 715 which is located on the right side and connected with the power supply line to a drain electrode 714 which is located on the left side and connected with a pixel electrode. In addition, In the cross sectional view along the line C-C', a current does not flow in this cross section because the absence of the silicon layer. This embodiment can be used for not only an OLED display device but also other display devices such as a display device using an inorganic EL material, an FED display device, an electrophoretic display device, and a liquid crystal display device.

Embodiment 2

Next, an embodiment in the case where the present invention is applied to a liquid crystal display device will be described.

Figure 11:
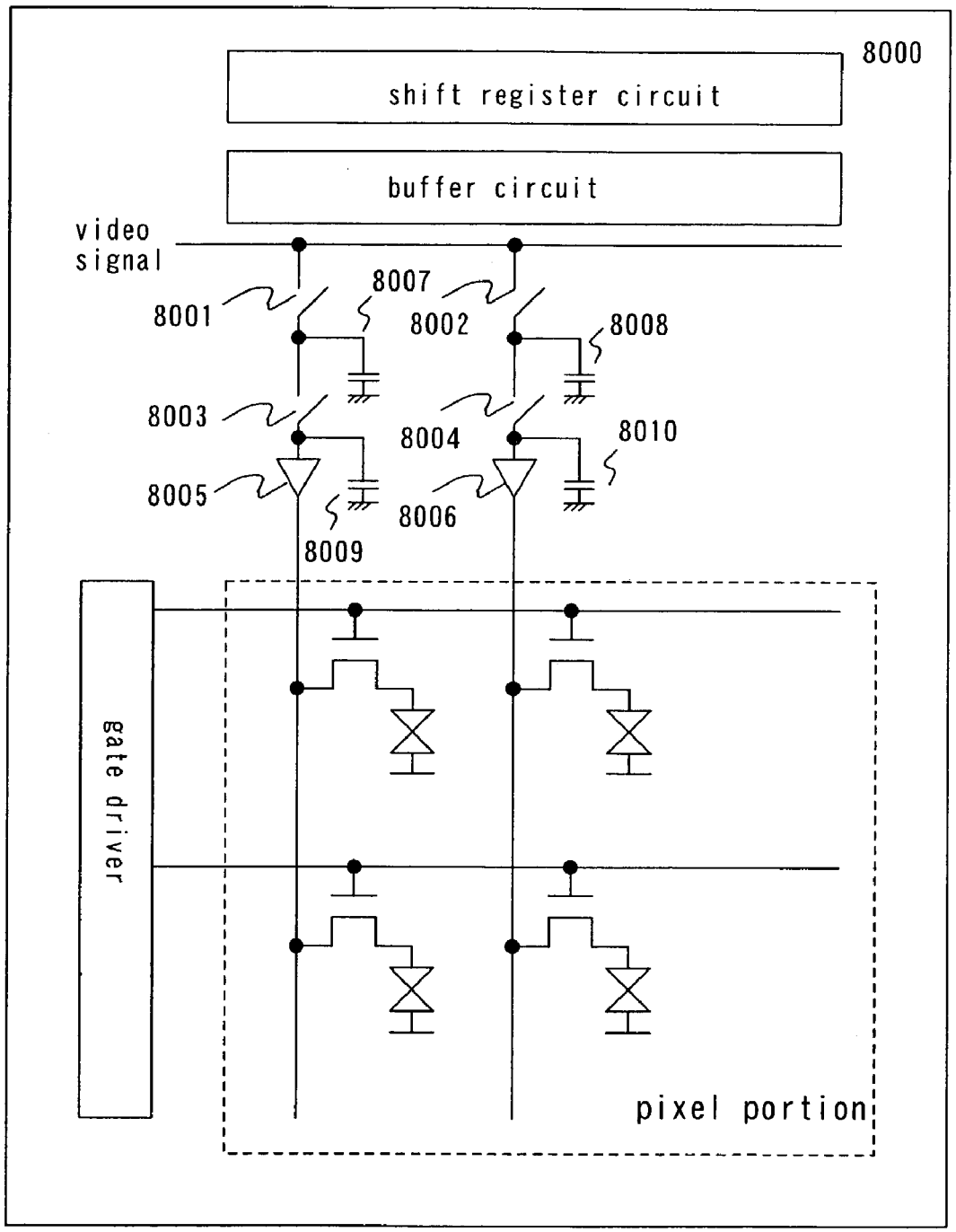
FIG. 11 is a block diagram of a liquid crystal display device using an analog buffer circuit.

FIG. 11 is a block diagram of a driver-integrated liquid crystal display device having an analog buffer circuit. In a small size liquid crystal display device, an area of a pixel portion is small and a capacity load of a source line is small so that an analog buffer circuit is unnecessary. Thus, dot sequential drive in which a video signal is directly sampled and written into the source signal line is possible. In a large size display device, a load of the source signal line is increased, as a screen becomes larger. Thus, a video signal cannot be directly written into the source signal line so that line sequential drive in which sampling is conducted to temporarily store it in an analog memory and then the source signal line is driven through an analog buffer circuit is necessary. However, when a variation in analog buffer circuits is large, there is a problem that a different output is generated for each source signal line even if the same voltage signal is applied, thereby resulting in display non-uniformity.

As typical examples of the analog buffer circuit, there are a source follower circuit and an operational amplifier. Those circuit diagrams are shown in FIGS. 12A, 12B, 13A, and 13B. First, in the source follower circuit, relative precision between a TFT 8201 and a TFT 8202, a TFT 8203 and a TFT 8204, a TFT 8205 and a TFT 8206, and a TFT 8207 and a TFT 8208 is required. Thus, it is necessary to arrange the respective two transistors so as to obtain relative precision. According to the present invention, an arrangement as shown in FIG. 12B is used so that threshold values and mobilities of the transistors can be made equal.

Figure 12A:
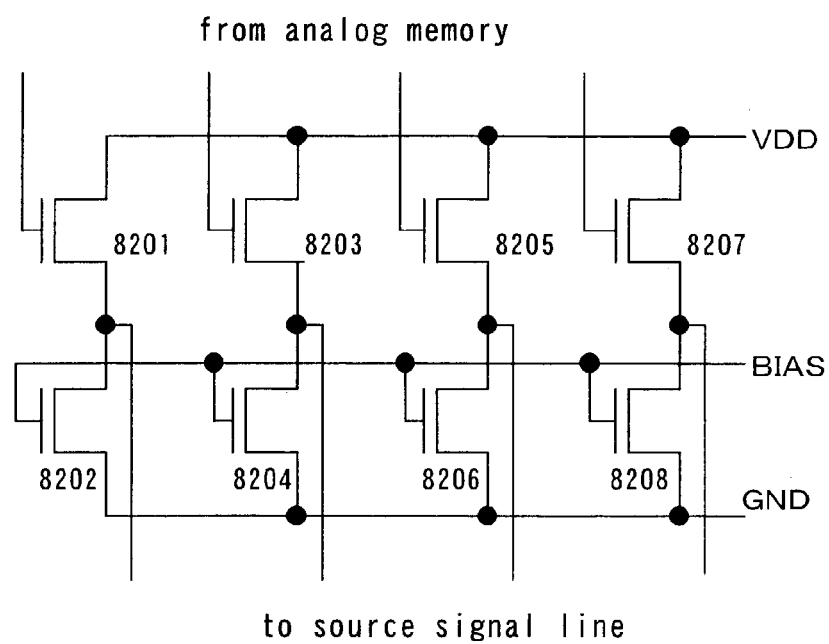
FIGS. 12A and 12B show an embodiment of a source follower in which TFTs are arranged on a projection.
Figure 12B:
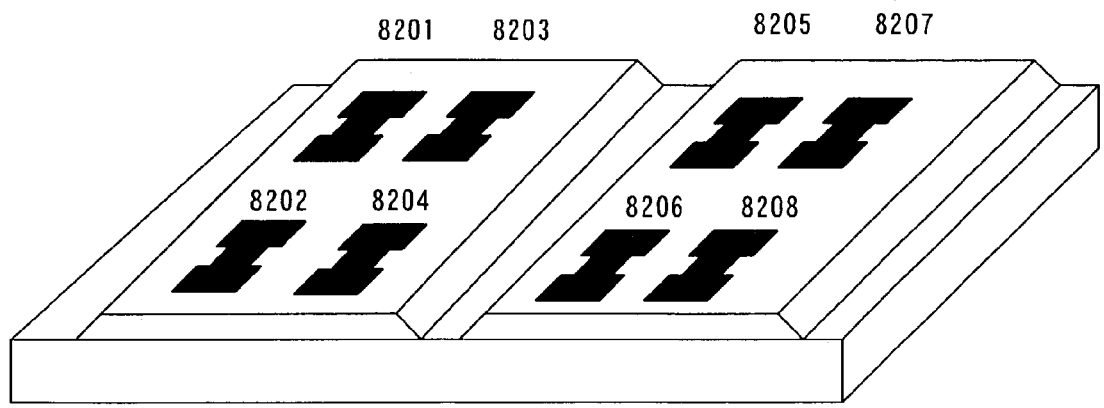
Figure 16:
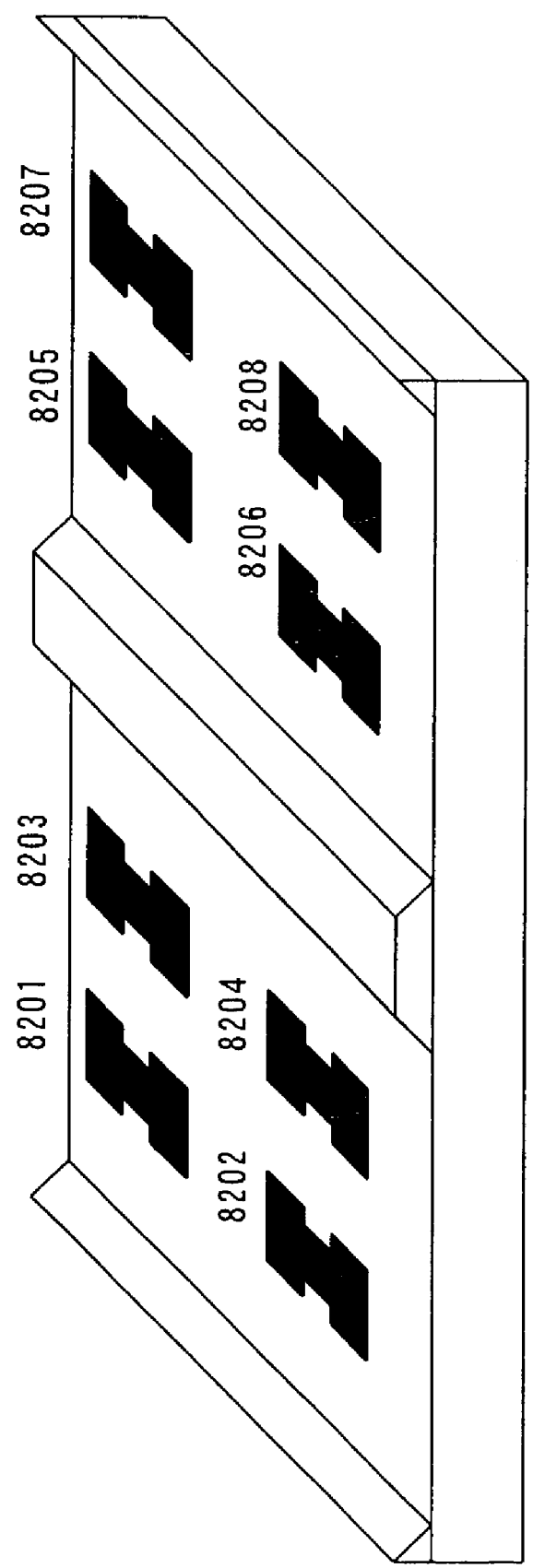
FIG. 16 shows an embodiment of a source follower in which TFTs are arranged on a depression.

FIGS. 12A and 12B show the example in which the TFTs are arranged on a projection. However, the arrangement is not limited to the projection and may be conducted on a depression. FIG. 16 shows an example in which the TFTs 8201 to 8208 are arranged on a depression.

Figure 13A:
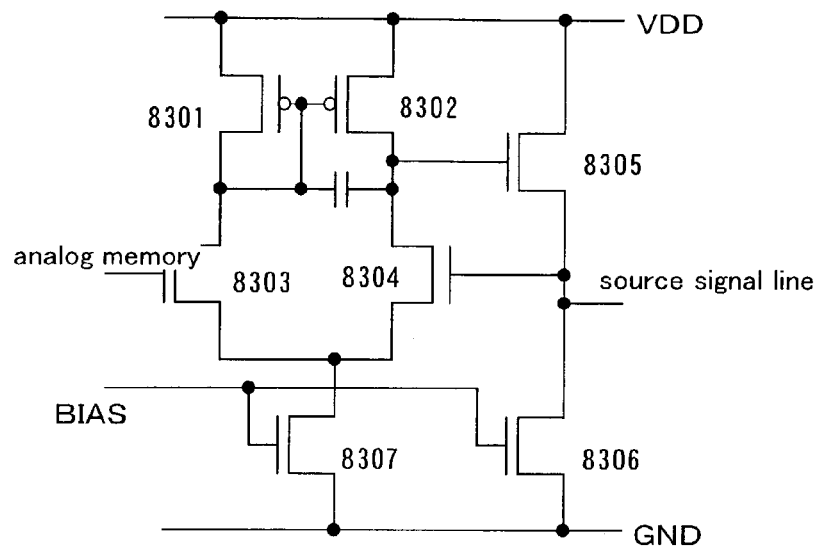
FIGS. 13A and 13B show an embodiment of an operational amplifier in which TFTs are arranged on a projection.
Figure 13B:
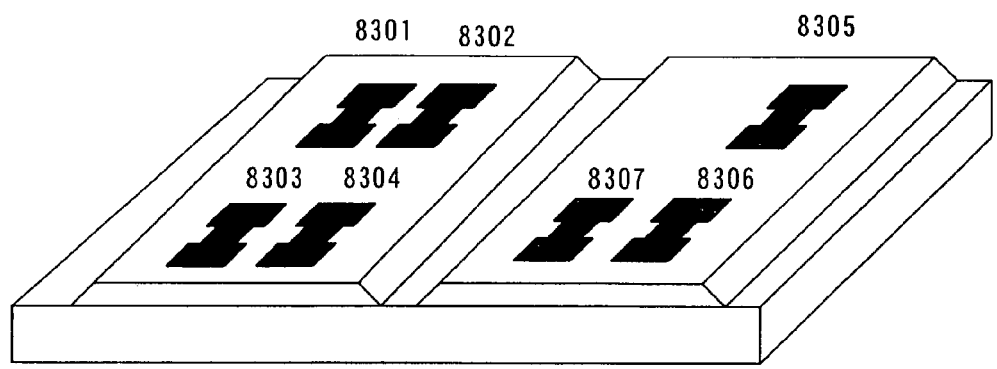
Figure 17:
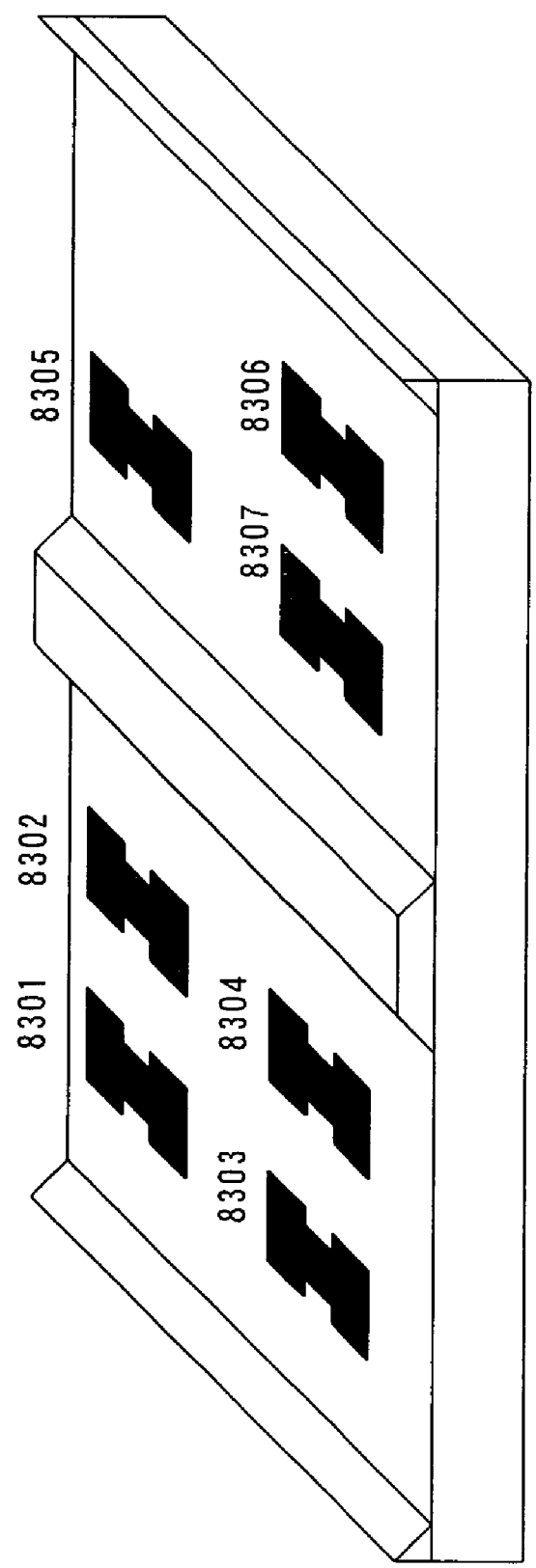
FIG. 17 shows an embodiment of a operational amplifier in which TFTs are arranged on a depression.

Also, FIG. 13A shows a circuit diagram of an operational amplifier. As shown in this drawing, an analog buffer circuit using an operational amplifier includes a current mirror circuit composed of TFTs 8301 and 8302, a differential circuit composed of TFTs 8303 and 8304, a source follower circuit composed of TFTs 8305 and 8306. In the case of the operational amplifier, matching is required for the TFTs which compose the current mirror circuit and the differential circuit. Here, matching of TFTs 8301 and 8302 and matching of TFTs 8303 and 8304 are particularly important. Thus, according to the present invention, an arrangement as shown in FIG. 13B is used so that high precision matching can be attained. In addition, in FIGS. 13A and 13B, the TFTs are arranged on the projection. However, the arrangement is not limited to the projection and may be conducted on a depression. FIG. 17 shows an example in which the TFTs 8301 to 8207 are arranged on the depression.

Also, although not shown, when the differential amplifier or the current mirror circuit is composed of two multi-channel TFTs described in Embodiment 1, characteristics with further less variation is obtained.

This embodiment can be used by being combined with Embodiment 1.

Embodiment 3

Figure 14A:
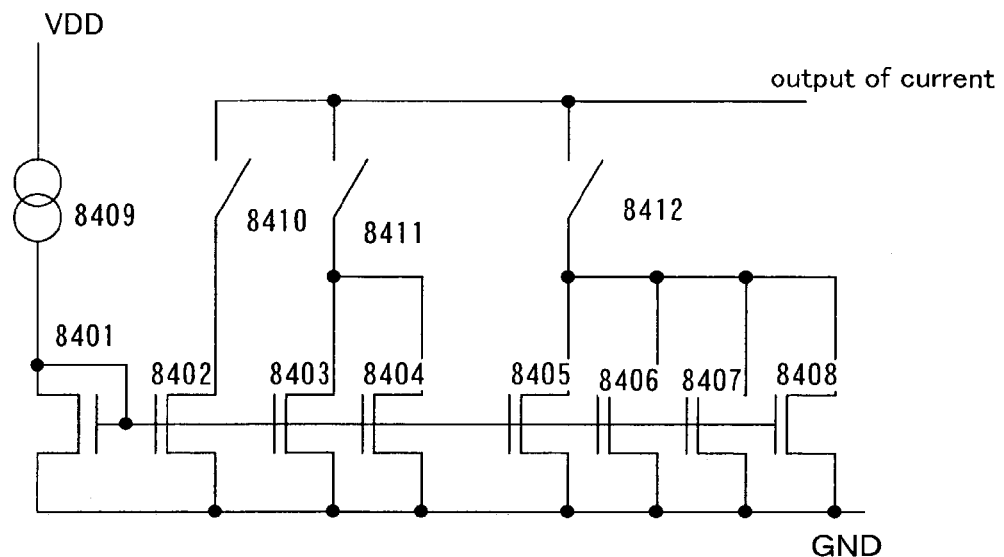
FIGS. 14A and 14B show an embodiment of an DA converting circuit in which TFTs are arranged on a projection.
Figure 14B:
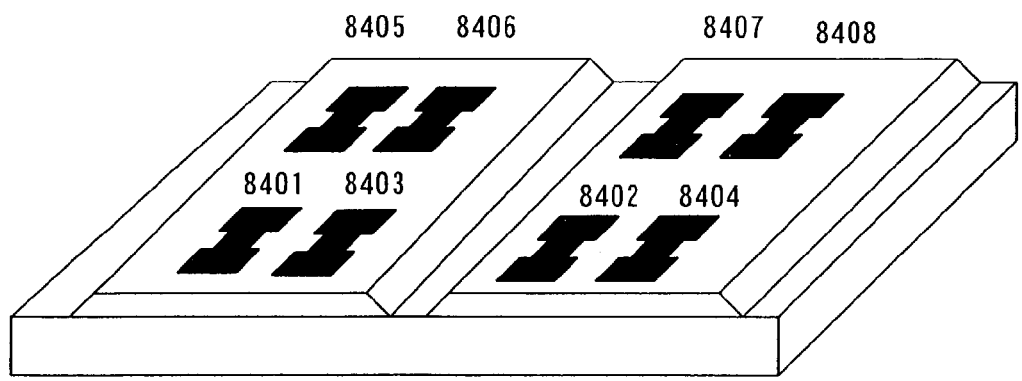
Figure 18:
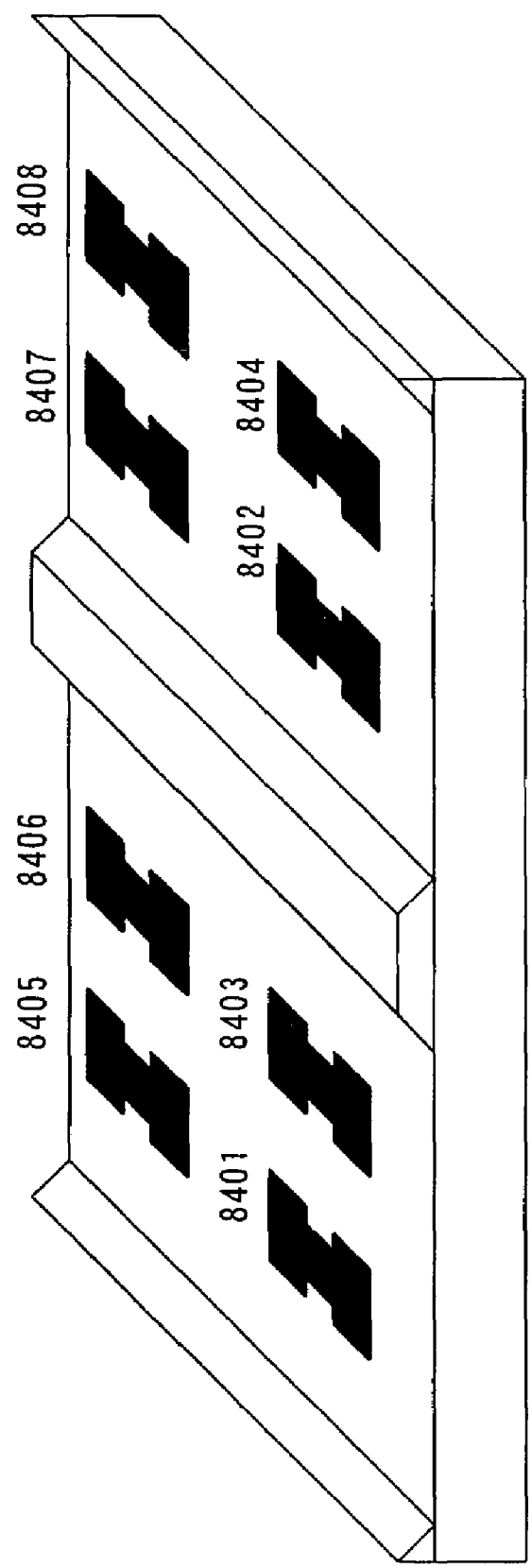
FIG. 18 shows an embodiment of a DA converting circuit in which TFTs are arranged on a depression.

FIGS. 14A and 14b show an embodiment of a DA converting circuit in the case where a driver having the DA converting circuit is integrally formed on a substrate. FIG. 14A shows a current output type 3-bit DA converting circuit. Although in FIG. 14, the 3-bit DA converter is shown, the present invention is not limited to 3 bits. The DA converting circuit outputs a current by switching current sources composed of TFT through switches 8410, 8411, and 8412. Here, in order to keep the linearity of DA conversion, matching of TFTs 8401 to 8408 is important. Thus, an arrangement shown in FIG. 14B is used to attain such TFT matching. When necessary matching of eight TFTs is conducted, they are divided into four each. The respective four TFTs are arranged on the same projection. In FIGS. 14A and 14B, the TFTs are arranged on the projection. However, the arrangement is not limited to the projection and may be conducted on a depression. FIG. 18 shows an example in which the TFTs 8401 to 8408 are arranged on the depression.

This embodiment can be used by being combined with Embodiments 1 and 2.

Embodiment 4

In this embodiment, an example of fabricating an OLED display device of the present invention will be described with reference to FIGS. 9A to 9C.

Figure 9A:
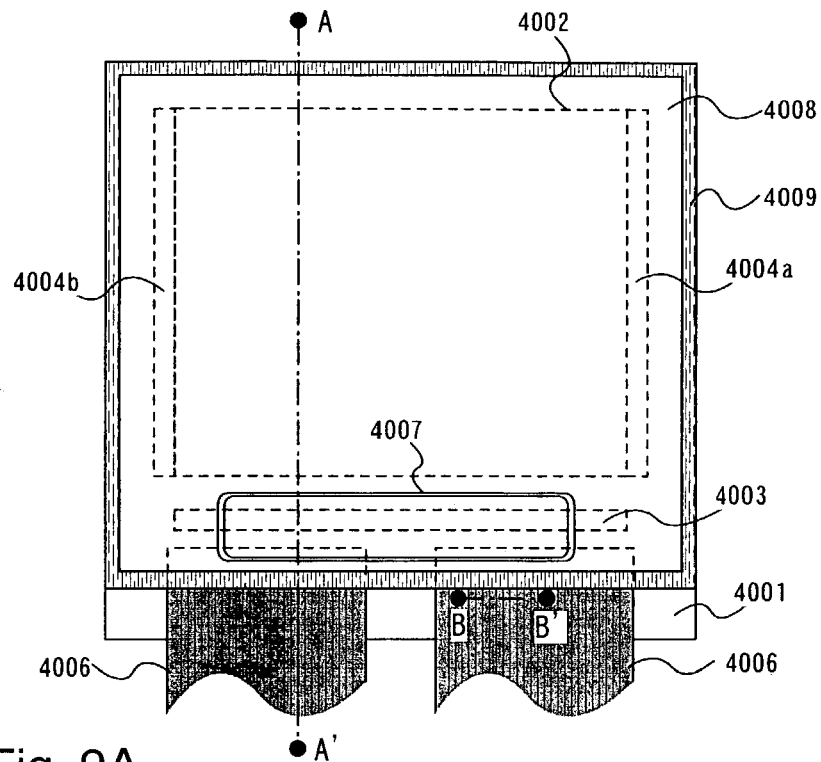
FIGS. 9A to 9C are top view and side views showing an outline of a display device of the present invention.
Figure 9B:
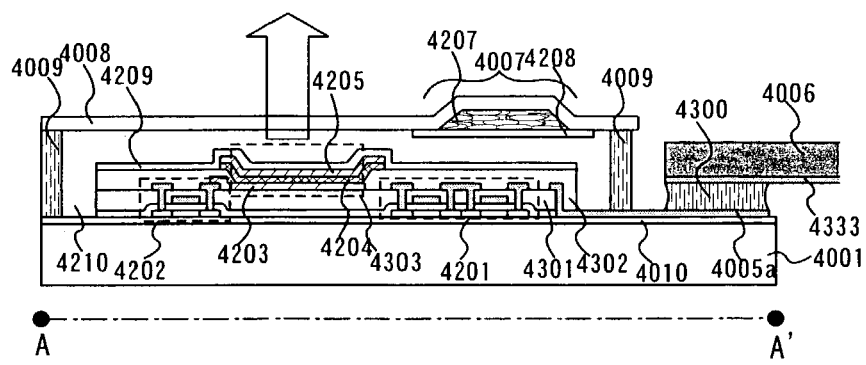
Figure 9C:
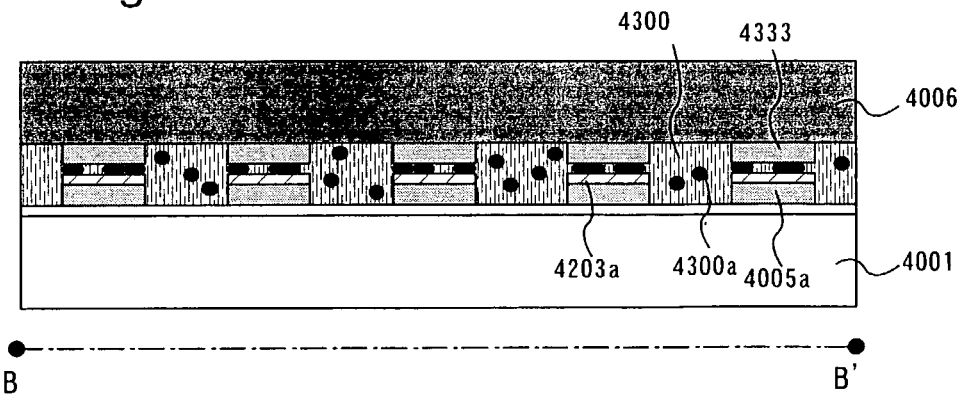

FIG. 9A is a top view of the OLED display device, FIG. 9B is a sectional view taken along a line A-A' of FIG. 9A, and FIG. 9C is a sectional view taken along a line B-B' of FIG. 9A.

A seal member 4009 is provided so as to surround a pixel portion 4002, a source signal line driving circuit 4003, and first and second gate signal line driving circuits 4004a and 4004b, which are provided on a substrate 4001. Further, a sealing member 4008 is provided over the pixel portion 4002, the source signal line driving circuit 4003, and the first and the second gate signal line driving circuits 4004a and 4004b. Thus, the pixel portion 4002, the source signal line driving circuit 4003, and the first and the second gate signal line driving circuits 4004a and 4004b are sealed with a filler 4210 by the substrate 4001, the seal member 4009, and the sealing member 4008.

Further, the pixel portion 4002, the source signal line driving circuit 4003, and the first and the second gate signal line driving circuits 4004a and 4004b provided on the substrate 4001 include a plurality of TFTs. FIG. 9B typically shows driving TFTs (here, an n-channel TFT and a p-channel TFT are shown) 4201 included in the source signal line driving circuit 4003 and a TFT 4202 (a TFT for inputting drain current to an OLED) included in the pixel portion 4002, which are formed on an under film 4010.

In this embodiment, the p-channel TFT and the n-channel TFT fabricated by a well-known method are used as the driving TFTs 4201, and a p-channel TFT fabricated by a well-known method is used as the pixel TFT 4202.

An interlayer insulating film (flattening film) 4301 is formed on the driving TFTs 4201 and the TFT 4202, and a pixel electrode (anode) 4203 electrically connected to a drain region of the TFT 4202 is formed thereon. A transparent conductive film with a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film doped with gallium may be used.

An insulating film 4302 is formed on the pixel electrode 4203, and an opening portion is formed in the insulating film 4302 over the pixel electrode 4203. In this opening portion, an OLED layer 4204 is formed on the pixel electrode 4203. A well-known organic material or inorganic material can be used for the OLED layer 4204. Although the organic material includes a low molecular (monomer) and a high molecular (polymer), either may be used.

As a formation method of the OLED layer 4204, a well-known evaporation technique or coating technique may be used. The structure of the OLED layer may be a laminate structure obtained by freely combining any of a hole injecting layer, a hole transporting layer, a light emitting layer, an electron transporting layer, and an electron injecting layer, or a single layer structure.

A cathode 4205 of a conductive film (typically, a conductive film containing aluminum, copper or silver as its main component, or a laminate film the above film and another conductive film) with a light shielding property is formed on the OLED layer 4204. It is desirable that moisture and oxygen existing on the interface between the cathode 4205 and the OLED layer 4204 are removed to the utmost. Accordingly, it is necessary to make such contrivance that the OLED layer 4204 is formed in a nitrogen or rare gas atmosphere, and the cathode 4205 is formed while the OLED layer is not exposed to oxygen or moisture. In this embodiment, a film forming apparatus with a multi-chamber system (cluster tool system) is used, and the film formation as described above is enabled. A predetermined voltage is applied to the cathode 4205.

As described above, an OLED 4303 constituted by the pixel electrode (anode) 4203, the OLED layer 4204, and the cathode 4205 is formed. Then, a protection film 4209 is formed on the insulating film 4302 so as to cover the OLED 4303. The protection film 4209 is effective to prevent oxygen, moisture and the like from penetrating into the OLED 4303.

Reference numeral 4005a designates a drawing wiring line connected to a power supply line and electrically connected to a source region of the TFT 4202. The drawing wiring line 4005a is formed between the seal member 4009 and the substrate 4001, and electrically connected to an FPC wiring line 4333 included in an FPC 4006 through an anisotropic conductive film 4300.

As the sealing member 4008, a glass member, a metal member (typically, a stainless member), a ceramic member, or a plastic member (including a plastic film) can be used. As the plastic member, an FRP (Fiberglass-Reinforced Plastics) plate, a PVF (polyvinyl fluoride) film, a Mylar film, a polyester film or an acryl resin film can be used. Further, a sheet that has such a structure that an aluminum foil is interposed between PVF films or Mylar films can also be used.

However, in the case where the radiation direction of light from the OLED is directed toward the side of the cover member, the cover member must be transparent. In this case, a transparent material such as a glass plate, a plastic plate, a polyester film, or an acryl film is used.

As the filler 4210, in addition to an inert gas such as nitrogen or argon, ultraviolet ray curing resin or thermosetting resin can be used. PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4210 to a hygroscopic material (preferably, barium oxide) or a material which is capable of absorbing oxygen, a recess portion 4007 is provided on the surface of the sealing member 4008 at the side of the substrate 4001, and the hygroscopic material or the material which is capable of absorbing oxygen 4207 is disposed. Then, in order to prevent the hygroscopic material or the material capable of absorbing oxygen 4207 from scattering, the hygroscopic material or the material capable of absorbing oxygen are held in the recess portion 4007 by a recess cover member 4208. Note that, the recess cover member 4208 is formed into a fine mesh, and has such a structure that air and moisture are permeated and the hygroscopic material or the material capable of absorbing oxygen 4207 is not permeated. The deterioration of the OLED 4303 can be suppressed by providing therewith the hygroscopic material or the material capable of absorbing oxygen 4207.

As shown in FIG. 9C, in forming the pixel electrode 4203, a conductive film 4203a is simultaneously formed to be in contact with the drawing wiring line 4005a.

The anisotropic conductive film 4300 includes a conductive filler 4300a. When the substrate 4001 and the FPC 4006 are thermally compressed, the conductive film 4203a over the substrate 4001 and the FPC wiring line 4333 on the FPC 4006 are electrically connected through the conductive filler 4300a.

This embodiment can be applied not only to the OLED display device, but also another display devices such as a display device using inorganic materials, an FED display device, an electrophoresis display device, and a liquid crystal display device. Further, this embodiment can be implemented by combining with Embodiments 1 to 3.

Embodiment 5

FIG. 10 shows a sectional-view illustrating the pixel structure of the OLED display device of the present invention. In this embodiment, an OLED and a TFT for making a drain current flow to an OLED is shown alone as one of elements that constitute a pixel of the OLED display device.

Figure 10A:
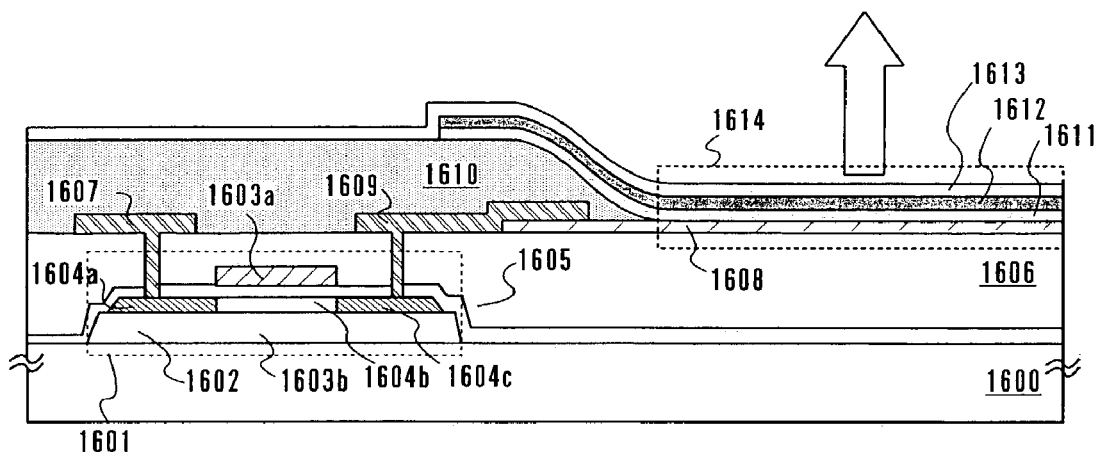
FIGS. 10A and 10B are cross sectional views showing structures of a pixel in a display device of the present invention.

In FIG. 10A, a TFT 1601 is formed on a pixel substrate 1600. The TFT 1601 has a source region and a drain region, and one of which is denoted by 1604a and the other of which is denoted by 1604c. After the TFT 1601 is formed, an interlayer film 1606 is formed.

The structure of the TFT 1601 is not limited to the one shown in the drawing. A TFT with any known structure can be employed as the TFT 1601.

Formed next is a transparent conductive film, typically an ITO film, which is then patterned into a desired shape to obtain a pixel electrode 1608. The pixel electrode 1608 here serves as an anode. Contact holes reaching the source region and drain region, namely 1604a and 1604c, of the TFT 1601 are formed in the interlayer film 1606. A laminate consisting of a Ti layer, an Al layer containing Ti, and another Ti layer is formed and patterned into a desired shape to obtain wiring lines 1607 and 1609. The TFT is made conductive by contacting the wiring line 1609 to the pixel electrode 1608.

Then, an insulating film is formed from an organic resin material such as acrylic. An opening is formed in the insulating film at a position that coincides with the position of the pixel electrode 1608 of an OLED 1614 to obtain an insulating film 1610. The opening has to be formed to have side walls tapered gently in order to avoid degradation or discontinuation of the OLED layer due to the level difference in side walls of the opening.

An OLED layer 1611 is formed next. Thereafter, an opposite electrode (cathode) 1612 of the OLED 1614 is formed from a laminate consisting of a cesium (Cs) film with 2 nm or less in thickness and a silver (Ag) film with 10 nm or less in thickness which are layered in order. If the opposite electrode 1612 of the OLED 1614 is very thin, light generated in the OLED layer 1611 is transmitted through the opposite electrode 1612 and emitted in the opposite direction to the pixel substrate 1600. Next, a protective film 1613 is formed in order to protect the OLED 1614.

In the display device that emits light in the opposite direction to the pixel substrate 1600, it is not necessary that light emitted from the OLED 1614 to be viewed travels through the elements formed over the pixel substrate 1600, including the TFT 1601. Therefore, the display devices can have a large aperture ratio.

The pixel electrode 1608 may serve as a cathode while the opposite electrode 1612 serves as an anode if TiN or the like is used to form the pixel electrode and a transparent conductive film such as an ITO film is used for the opposite electrode. Then, light generated in the OLED layer 1611 can be emitted from the anode side in the opposite direction to the pixel substrate 1600.

Figure 10B:
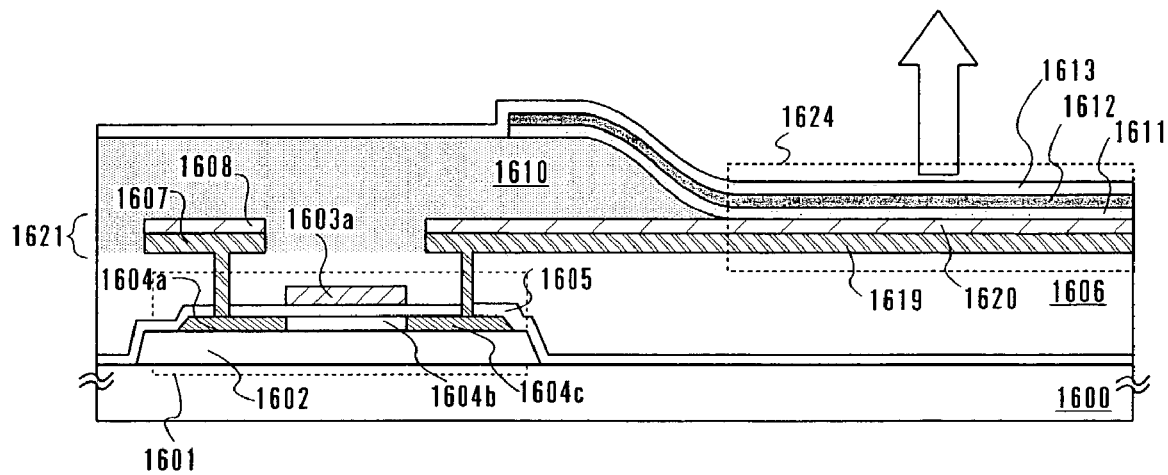

FIG. 10B is a sectional view showing the structure of a pixel that has an OLEDtructured differently from FIG. 10A.

Components in FIG. 10B that are identical with those in FIG. 10A are denoted by the same reference symbols in the explanation.

The pixel of FIG. 10B is formed in accordance with the same process as that for the pixel of FIG. 10A up to forming the TFT 1601 and the interlayer film 1606.

Next, contact holes reaching the source region and drain region, 1604a and 1604c, of the TFT 1601 are formed in the interlayer film 1606. Thereafter, a laminate consisting of a Ti layer, an Al layer containing Ti, and another Ti layer is formed, and a transparent conductive film, typically an ITO film, is formed in succession. The laminate and the transparent conductive film are patterned into desired shapes to obtain wiring lines 1621 and 1619 and a pixel electrode 1620. The wiring line 1621 is composed of 1617 and 1618b. The pixel electrode 1620 serves as an anode of an OLED 1624.

Then, an insulating film is formed from an organic resin material such as acrylic. An opening is formed in the insulating film at a position that coincides with the position of the pixel electrode 1620 of the OLED 1624 to obtain the insulating film 1610. The opening has to be formed to have side walls tapered gently in order to avoid degradation or discontinuation of the OLED layer due to the level difference in side walls of the opening.

The OLED layer 1611 is formed next. Thereafter, an opposite electrode (cathode) 1612 of the OLED 1624 is formed from a laminate consisting of a cesium (Cs) film with 2 nm or less in thickness and a silver (Ag) film with 10 nm or less in thickness which are layered in order. If the opposite electrode 1612 of the OLED 1624 is very thin, light generated in the OLED layer 1611 is transmitted through the opposite electrode 1612 and emitted in the opposite direction to the pixel substrate 1600. Next, the protective film 1613 is formed in order to protect the OLED 1624.

In the display device that emits light in the opposite direction to the pixel substrate 1600, it is not necessary that light emitted from the OLED 1624 to be viewed travels through the elements formed over the pixel substrate 1600, including the TFT 1601. Therefore, the display devices can have a large aperture ratio.

The pixel electrode 1620 and the wiring line 1621 may serve as a cathode while the opposite electrode 1612 serves as an anode if TiN or the like is used to form the pixel electrode and a transparent conductive film such as an ITO film is used for the opposite electrode. Then, light generated in the OLED layer 1611 can be emitted from the anode side in the opposite direction to the pixel substrate 1600.

In this case, it is necessary to structure the TFT for making current flow to an OLED in the display device of the present invention by using p-type.

Compared to the pixel with the structure as shown in FIG. 10A, the pixel with the structure as shown in FIG. 10B can reduce the number of photo masks required in the manufacturing process and can simplify the process since the wiring line 1619, which is connected to the source region or drain region of the driving TFT, and the pixel electrode 1620 can be patterned by using the same photo mask.

This embodiment can be applied not only to the OLED display device, but also another display devices such as a display device using inorganic materials, an FED display device, an electrophoresis display device, and a liquid crystal display device. Further, this embodiment can be implemented by combining with Embodiments 1 to 4.

Embodiment 6

In this embodiment, an external light emitting quantum efficiency can be remarkably improved by using an organic light emitting material by which phosphorescence from a triplet exciton can be employed for emitting a light. As a result, the power consumption of the light emitting element can be reduced, the lifetime of the light emitting element can be elongated and the weight of the light emitting element can be lightened.

The following is a report where the external light emitting quantum efficiency is improved by using the triplet exciton (T. Tsutsui, C. Adachi, S. Saito, Photochemical Processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical Formula 1)

(M. A. Baldo, D. F. O'Brien, Y. You, A. Shoustikov, S. Sibley, M. E. Thompson, S. R. Forrest, Nature 395 (1998) p.151)

The molecular formula of an organic light emitting material (Pt complex) reported by the above article is represented as follows.

(Chemical Formula 2)

(M. A. Baldo, S. Lamansky, P. E. Burrows, M. E. Thompson, S. R. Forrest, Appl. Phys. Lett., 75 (1999) p.4.) (T.Tsutsui, M.-J.Yang, M. Yahiro, K. Nakamura, T.Watanabe, T. Tsuji, Y Fukuda, T. Wakimoto, S. Mayaguchi, Jpn, Appl. Phys., 38 (12B) (1999) L1502)

The molecular formula of an organic light emitting material (Ir complex) reported by the above article is represented as follows.

(Chemical Formula 3)

As described above, if phosphorescence from a triplet exciton can be put to practical use, it can realize the external light emitting quantum efficiency three to four times as high as that in the case of using fluorescence from a singlet exciton in principle.

Embodiment 7

A display device formed using a light emitting device such as the OLED has superior visibility in bright locations in comparison to a liquid crystal display device because it is a self-emission type, and moreover its field of vision is wide. Accordingly, it can be used as a display portion for various electronic apparatus.

Further, the present invention can be used as display device other than self-emission display device, such as the electrophoresis display device, or the liquid crystal display device of various electronic apparatuses.

The following can be given as examples of such electronic apparatuses of the present invention: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital versatile disk (DVD)). In particular, because portable information terminals are often viewed from a diagonal direction, the wideness of the field of vision is regarded as very important. Thus, it is preferable that the light emitting device is employed. Examples of these electronic apparatus are shown in FIGS. 15A to 15H.

Figure 15A:
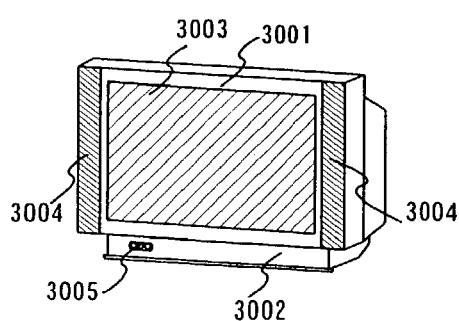
FIGS. 15A to 15H show examples of electronic devices to which the present invention can be applied.

FIG. 15A is a display device, containing a casing 3001, a support stand 3002, a display portion 3003, a speaker portion 3004, and a video input portion 3005. The present invention can be used in the display portion 3303. Since the light emitting display is a self-emission type device with no need of a back light, its display portion can be made thinner than a liquid crystal display device. The term display device here refers to all display devices such as a device for personal computer, a device for TV broad casting, and a device for advertisement.

Figure 15B:
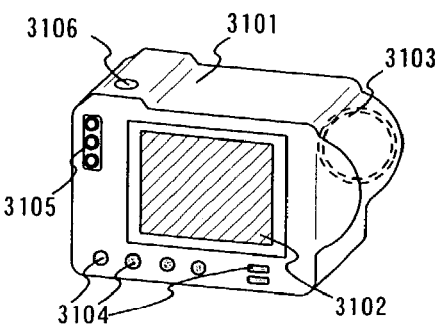

FIG. 15B is a digital still camera, containing a main body 3101, a display portion 3102, an audio input portion 3103, operation switches 3104, an external connecting port 3105, and a shutter 3106. The present invention can be used in the display portion 3102.

Figure 15C:
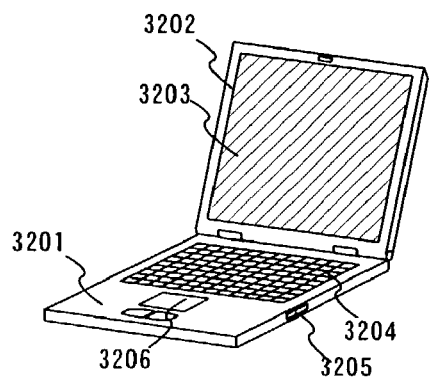

FIG. 15C is a laptop computer, containing a main body 3201, a frame 3202, a display portion 3203, a key board 3204, an external connection port 3205, and a pointing mouse 3206. The present invention can be used in the display portion 3203.

Figure 15D:
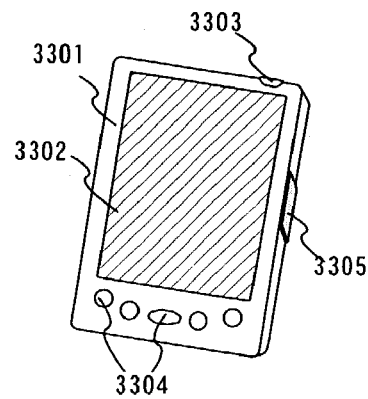

FIG. 15D is a mobile computer, containing a main body 3301, a display portion 3302, a switch 3303, an operation key 3304, and an infrared port 3305. The present invention can be used in the display portion 3302.

Figure 15E:
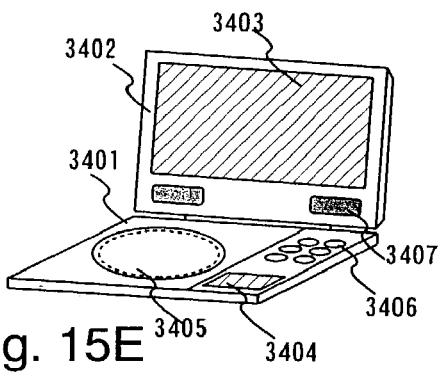

FIG. 15E is an image playback device (specifically, a DVD playback device) provided with a recording medium, containing a main body 3401, a display portion A 3403, a display portion B 3404, recording medium (such as a DVD) 3405, operation keys 3406, and a speaker portion 3407. The display portion A 3403 is mainly used for displaying image information, and the display portion B 3403 is mainly used for displaying character information, and the present invention can be used in the display portion A 3403 and in the display portion B 3403. Note that domestic game equipment is included as the image playback device provided with a recording medium.

Figure 15F:
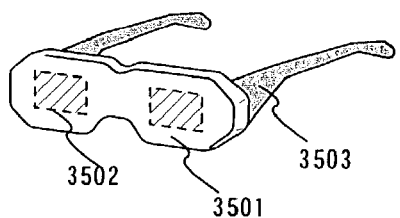

FIG. 15F is a goggle type display device (head mounted display), containing a main body 3501, a display portion 3502, and arm portion 3503. The present invention can be used in the display portion 3502.

Figure 15G:
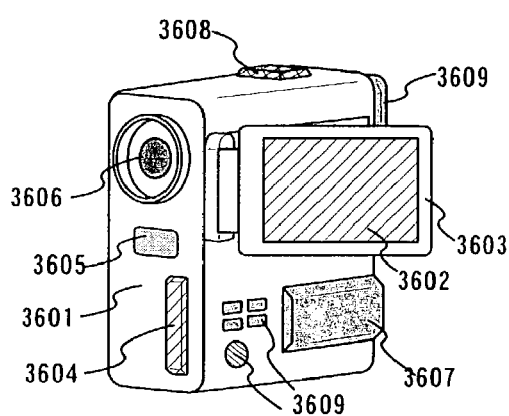

FIG. 15G is a video camera, containing a main body 3601, a display portion 3602, a frame 3603, an external connection port 3604, remote control receiving portion 3605, image receiving portion 3606, a battery 3607, and a sound input portion 3608, and an operation key 3609. The present invention can be used in the display portion 3602.

Figure 15H:
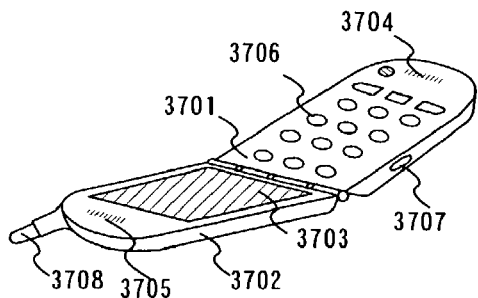

FIG. 15H is a cell phone, containing 3701, a frame 3702, a display portion 3703, a sound input portion 3704, a sound output portion 3705, an operation key 3706, an external connection port 3707, and an antenna 3708. The present invention can be used in the display portion 3703. Note that by displaying white characters in a black background in the display portion 3703, the power consumption of the cell phone can be reduced.

Note that if the emission luminance of organic light emitting materials becomes higher in the future, it will be possible to use the display device of the present invention in a front type or a rear type projector by projecting light including output images, which can be enlarged by lenses or the like.

The above electronic apparatus are becoming more often used to display information provided through an electronic telecommunication line such as the Internet or CATV (cable television), and in particular, opportunities for displaying animation information are increasing. The response speed of organic light emitting materials is extremely high, and therefore the light emitting device is favorable for performing animation display.

In the case that the present invention is used in the light emitting display device such as the OLED display device and the FED display device, it is preferable to display information so as to have the emitting portion become as small as possible since the light emitting portion of the light emitting device consumes power. Therefore, when using the light emitting device in a display portion which mainly displays character information, such as a portable information terminal, in particular, a cell phone and an audio reproducing device, it is preferable to drive it by setting non-emitting portions as background and forming character information in emitting portions.

The range of applications of the present invention is thus extremely wide, and it is possible to apply the present invention to electronic apparatuses in all fields.

As described above, according to the present invention, the steps are intentionally formed on the substrate and then portions corresponding to the thin film transistors are formed on the projection or the depression of the steps so that the thin film transistors in which the number of grain boundaries is small can be produced. Thus, TFT characteristics with less variation can be obtained. Accordingly, it is possible that a display device with less display nonuniformity is realized.

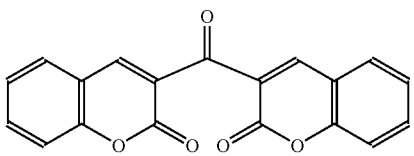

Chemical Formula 1

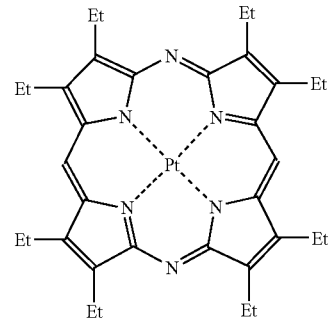

Chemical Formula 2

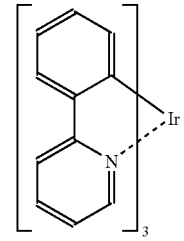

Chemical Formula 3

What is claimed is:

1. A display device comprising a plurality of pixels arranged in matrix over a substrate and a driver circuit for driving the pixels integrally formed over the substrate,
   wherein the driver circuit comprises a thin film transistor,
   wherein an insulating film over the substrate has a depression; and
   wherein the whole area of an active layer including a channel formation region of the thin film transistor is located in a flat region of the depression of the insulating film.

2. A display device according to claim 1, wherein the channel formation region of the thin film transistor is crystallized by laser light, and the laser light is irradiated using one kind or plural kinds of lasers selected from the group consisting of a YAG laser, a $YVO_4$ laser, a YLF laser, a $YAlO_3$ laser, a glass laser, a ruby laser, an alexandrite laser, a Ti:sapphire laser, and $Nd:YVO_4$ laser.

3. A display device according to claim 2, wherein the laser light for crystallization is a linear beam and a deviation in laser power is 5% or less.

4. A display device according to claim 1, wherein the display device is one of a liquid crystal display device, an OLED display device, an FED display device, and an electrophoretic display device.

5. An electronic device comprising the display device according to claim 1, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

6. A display device according to claim 1, further comprising:
a second thin film transistor,
wherein both the thin film transistor in the driver circuit and the second thin film transistor are located in the flat region of the depression of the insulating film.

7. A display device comprising a plurality of pixels arranged in matrix over a substrate and a driver circuit for driving the pixels integrally formed over the substrate, wherein:
the pixels each have a thin film transistor;
the driver circuit comprises a thin film transistor; and
the thin film transistors in the pixels and the driver circuit each have a channel formation region over a depression or a projection of an insulating film with stripe-shaped or rectangular-shaped unevenness which is formed over the substrate.

8. A display device according to claim 7, wherein the channel formation regions of the thin film transistors are crystallized by laser light, and the laser light is irradiated using one kind or plural kinds of lasers selected from the group consisting of a YAG laser, a $YVO_4$ laser, a YLF laser, a $YAlO_3$ laser, a glass laser, a ruby laser, an alexandrite laser, a Ti:sapphire laser, and Nd:$YVO_4$ laser.

9. A display device according to claim 8, wherein the laser light for crystallization is a linear beam and a deviation in laser power is 5% or less.

10. A display device according to claim 7, wherein the display device is one of a liquid crystal display device, an OLED display device, an FED display device, and an electrophoretic display device.

11. An electronic device comprising the display device according to claim 7, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

12. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has an analog buffer circuit of a source follower comprising thin film transistors, and
wherein channel formation regions of the thin film transistors in the source follower are located over the same projection or adjacent projections of an insulating film with unevenness which is formed over the substrate.

13. An electronic device comprising the display device according to claim 12, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

14. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has an analog buffer circuit of a source follower comprising thin film transistors, and
wherein channel formation regions of the thin film transistors in the source follower are located over the same depression or adjacent depressions of an insulating film with unevenness which is formed over the substrate.

15. An electronic device comprising the display device according to claim 14, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

16. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has an analog buffer circuit having a differential circuit comprising thin film transistors, and
wherein channel formation regions of the thin film transistors in the differential circuit are located over the same projection or adjacent projections of an insulating film with unevenness which is formed over the substrate.

17. An electronic device comprising the display device according to claim 16, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

18. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has an analog buffer circuit having a differential circuit comprising thin film transistors, and
wherein channel formation regions of the thin film transistors in the differential circuit are located over the same depression or adjacent depressions of an insulating film with unevenness which is formed over the substrate.

19. An electronic device comprising the display device according to claim 18, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

20. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has an analog buffer circuit having a current mirror comprising thin film transistors, and
wherein channel formation regions of the thin film transistors in the current mirror circuit are located over the same projection or adjacent projections of an insulating film with unevenness which is formed over the substrate.

21. An electronic device comprising the display device according to claim 20, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

22. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has an analog buffer circuit having a current mirror comprising thin film transistors, and
wherein channel formation regions of the thin film transistors in the current mirror circuit are located over the same depression or adjacent depressions of an insulating film with unevenness which is formed over the substrate.

23. An electronic device comprising the display device according to claim 22, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

24. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has a DA converting circuit comprising thin film transistors, and
wherein channel formation regions of the thin film transistors in the DA converting circuit are located over the same projection or adjacent projections of an insulating film with unevenness which is formed over the substrate.

25. An electronic device comprising the display device according to claim 24, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

26. A display device comprising a plurality of signal lines, a plurality of scan lines, and a plurality of pixels which are arranged in matrix over a substrate, and a driver circuit for driving the signal lines or the scan lines which is integrally formed over the substrate,
wherein the driver circuit has a DA converting circuit comprising thin film transistors, and
wherein channel formation regions of the thin film transistors in the DA converting circuit are located over the same depression or adjacent depressions of an insulating film with unevenness which is formed over the substrate.

27. An electronic device comprising the display device according to claim 26, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

28. A display device comprising a plurality of signal lines, a plurality of scan lines, a plurality of power supply lines, and a plurality of pixels over a substrate, wherein:
the pixels each have an OLED, at least one switching thin film transistor, and an OLED driving thin film transistor;
the OLED driving thin film transistor is a multi-channel transistor having a plurality of channel formation regions; and
the channel formation regions are located over same depressions or same projections of an insulating film with unevenness which is formed over the substrate.

29. An electronic device comprising the display device according to claim 28, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

30. A display device comprising a plurality of signal lines, a plurality of scan lines, a plurality of power supply lines, and a plurality of pixels over a substrate, wherein:
the pixels each have an OLED, at least one switching thin film transistor, and an OLED driving thin film transistor;
the OLED driving thin film transistor is a multi-channel transistor having a plurality of channel formation regions; and
the channel formation regions are located over adjacent depressions or adjacent projections of an insulating film with unevenness which is formed over the substrate.

31. An electronic device comprising the display device according to claim 30, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

32. A display device comprising a plurality of signal lines, a plurality of scan lines, a plurality of power supply lines, and a plurality of pixels over a substrate, wherein:
each of the pixels comprise:
a light emitting element;
at least one switching thin film transistor; and
a light emitting element driving thin film transistor;
the light emitting element driving thin film transistor is a multi-channel transistor having a plurality of channel formation regions; and
the channel formation regions are located over same depressions or same projections of an insulating film with unevenness which is formed over the substrate.

33. An electronic device comprising the display device according to claim 32, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

34. A display device comprising a plurality of signal lines, a plurality of scan lines, a plurality of power supply lines, and a plurality of pixels over a substrate, wherein:
the pixels each comprise:
a light emitting element;
at least one switching thin film transistor; and a light emitting element driving thin film transistor;
the light emitting element driving thin film transistor is a multi-channel transistor having a plurality of channel formation regions; and
the channel formation regions are located over adjacent depressions or adjacent projections of an insulating film with unevenness which is formed over the substrate.

35. An electronic device comprising the display device according to claim 34, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

36. A display device comprising:
a plurality of pixels arranged in matrix over a substrate;
a driver circuit for driving the plurality of pixels formed over the substrate; and
an insulating film having a projection formed over the substrate,
wherein the driver circuit comprises a thin film transistor, and
wherein a whole area of an active layer of the thin film transistor is located in a flat region of the projection of the insulating film.

37. A display device according to claim 36, wherein the display device is one of a liquid crystal display device, an OLED display device, an FED display device and an electrophoretic display device.

38. An electronic device comprising the display device according to claim 36, wherein the electronic device is selected from the group consisting of a video camera, a digital camera, a goggle type display, a car navigation system, a car audio system, an audio compo system, a notebook personal computer, a game equipment, a mobile computer, a mobile telephone, a mobile game equipment, an electronic book and a DVD player.

39. A display device according to claim 36, further comprising:
a second thin film transistor,
wherein both the thin film transistor in the driver circuit and the second thin film transistor are located in the flat region of the projection of the insulating film.

* * * * *